US009441309B2

(12) United States Patent
Fredenberg et al.

(10) Patent No.: US 9,441,309 B2
(45) Date of Patent: Sep. 13, 2016

(54) ELECTRODE AND METHOD OF FORMING THE MASTER ELECTRODE

(71) Applicant: LUXEMBOURG INSTITUTE OF SCIENCE AND TECHNOLOGY (LIST), Esch-sur-Alzette (LU)

(72) Inventors: Mikael Fredenberg, Stockholm (SE); Patrik Möller, Stockholm (SE); Peter Wiwen-Nilsson, Stockholm (SE); Cecilia Aronsson, Sundbyberg (SE); Matteo Dainese, Solna (SE)

(73) Assignee: Luxembourg Institute of Science and Technology (LIST), Luxembourg (LU)

( * ) Notice: Subject to any disclaimer, the term of this patent is extended or adjusted under 35 U.S.C. 154(b) by 132 days.

(21) Appl. No.: 14/135,745

(22) Filed: Dec. 20, 2013

(65) Prior Publication Data

US 2014/0110265 A1 Apr. 24, 2014

Related U.S. Application Data

(63) Continuation of application No. 13/429,733, filed on Mar. 26, 2012, now Pat. No. 8,617,362, which is a continuation of application No. 12/470,452, filed on May 21, 2009, now abandoned, which is a continuation of application No. 12/085,157, filed as application No. PCT/SE2006/001320 on Nov. 20, 2006, now abandoned.

(30) Foreign Application Priority Data

Nov. 18, 2005 (SE) ....................................... 0502538
Nov. 18, 2005 (SE) ....................................... 0502539

(51) Int. Cl.
*C25D 1/00* (2006.01)
*C25D 1/10* (2006.01)

(Continued)

(52) U.S. Cl.
CPC ............. *C25D 5/02* (2013.01); *B81C 99/0085* (2013.01); *C23C 14/34* (2013.01);
(Continued)

(58) Field of Classification Search
None
See application file for complete search history.

(56) References Cited

U.S. PATENT DOCUMENTS 4,158,612 A 6/1979 Luch et al.
5,612,153 A 3/1997 Moulton et al.

(Continued)

FOREIGN PATENT DOCUMENTS

DE 19935558 A1 3/2001
WO 9925903 A1 5/1999

(Continued)

OTHER PUBLICATIONS

International Preliminary Report on Patentability from application PCT/SE2006/001320 dated May 20, 2008.

(Continued)

*Primary Examiner* — Harry D Wilkins, III
(74) *Attorney, Agent, or Firm* — James E. Walton

(57) ABSTRACT

An electrode for forming an electrochemical cell with a substrate and a method of forming said electrode. The electrode comprises a carrier provided with an insulating layer which is patterned at a front side. Conducting material in an electrode layer is applied in the cavities of the patterned insulating layer and in contact with the carrier. A connection layer is applied at the backside of the carrier and in contact with the carrier. The periphery of the electrode is covered by the insulating material.

15 Claims, 15 Drawing Sheets

4 7 1 8 5 2

(51) Int. Cl.

| | |
|---|---|
| ***C25D 5/02*** | (2006.01) |
| ***B81C 99/00*** | (2010.01) |
| ***C25D 5/10*** | (2006.01) |
| ***C25F 3/14*** | (2006.01) |
| ***H01L 21/288*** | (2006.01) |
| ***H01L 21/3213*** | (2006.01) |
| ***H01L 21/768*** | (2006.01) |
| ***H05K 3/07*** | (2006.01) |
| ***H05K 3/24*** | (2006.01) |
| ***H05K 3/46*** | (2006.01) |
| ***C23C 14/34*** | (2006.01) |
| ***C25D 5/50*** | (2006.01) |
| ***C25D 7/12*** | (2006.01) |
| *H05K 3/10* | (2006.01) |

(52) U.S. Cl.

CPC .......... *C23C 14/3414* (2013.01); *C25D 1/003* (2013.01); *C25D 1/10* (2013.01); *C25D 5/022* (2013.01); *C25D 5/10* (2013.01); *C25D 5/50* (2013.01); *C25D 7/12* (2013.01); *C25D 7/123* (2013.01); *C25F 3/14* (2013.01); *H01L 21/2885* (2013.01); *H01L 21/32134* (2013.01); *H01L 21/76838* (2013.01); *H01L 21/76843* (2013.01); *H01L 21/76852* (2013.01); *H01L 21/76873* (2013.01); *H01L 21/76877* (2013.01); *H01L 21/76885* (2013.01); *H05K 3/07* (2013.01); *H05K 3/241* (2013.01); *H05K 3/4647* (2013.01); *H05K 3/108* (2013.01); *H05K 2203/0117* (2013.01); *H05K 2203/0733* (2013.01); *Y10T 156/10* (2015.01)

(56) References Cited

U.S. PATENT DOCUMENTS

| | | | | |
|---|---|---|---|---|
| 6,355,147 | B1 | 3/2002 | Griffiths et al. | |
| 8,617,362 | B2 * | 12/2013 | Fredenberg | C25F 3/14 204/281 |
| 2004/0099534 | A1 | 5/2004 | Powers | |
| 2005/0032362 | A1 | 2/2005 | Cohen et al. | |
| 2005/0202180 | A1 | 9/2005 | Cohen et al. | |
| 2007/0059919 | A1 | 3/2007 | Ooka | |

FOREIGN PATENT DOCUMENTS

| | | | |
|---|---|---|---|
| WO | 02103085 | A1 | 12/2002 |
| WO | 03095715 | A1 | 11/2003 |
| WO | 2004099469 | A1 | 11/2004 |
| WO | 2007058603 | A1 | 5/2007 |
| WO | 2007058604 | A1 | 5/2007 |
| WO | 2007058605 | A1 | 5/2007 |

OTHER PUBLICATIONS

Office Action from U.S. Appl. No. 12/085,157 mailed Jul. 22, 2011.

Office Action from U.S. Appl. No. 12/470,452 mailed Sep. 27, 2011.

Office Action from U.S. Appl. No. 13/429,733 mailed Feb. 22, 2013.

International Search Report from PCT/SE2006/001319 dated Mar. 9, 2007.

International Search Report from PCT/SE2006/001321 dated Mar. 27, 2007.

Written Opinion of the ISA from application PCT/SE2006/001320 dated Mar. 23, 2007.

* cited by examiner

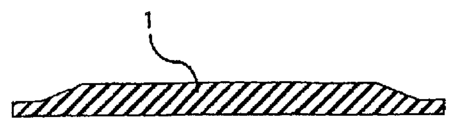
Figure 8(a)
Figure 8(e)
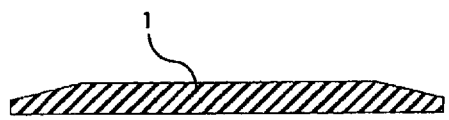
Figure 8(b)
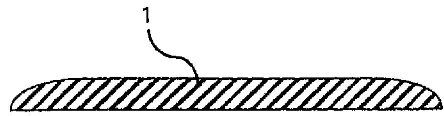
Figure 8(f)
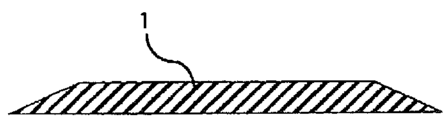
Figure 8(c)
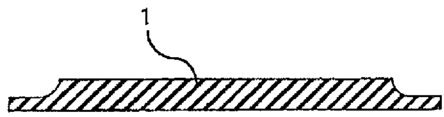
Figure 8(g)
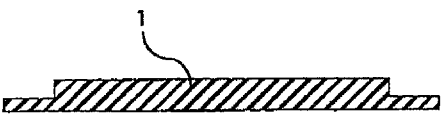
Figure 8(d)
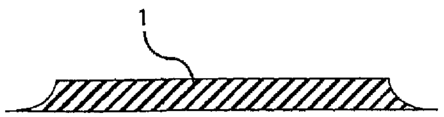
Figure 8(h)

ELECTRODE AND METHOD OF FORMING THE MASTER ELECTRODE

This application is a continuation of U.S. application Ser. No. 12/470,452 filed 21 May 2009, titled "Electrode and Method of Forming the Master Electrode," which is a continuation of U.S. application Ser. No. 12/085,157 filed 13 May 2009, titled "Electrode and Method of Forming the Master Electrode," which is a National Stage Entry of P.C.T. Application No. PCT/SE2006/001320, filed 20 Nov. 2006, titled "Electrode and Method of Forming the Master Electrode," which claimed priority to Swedish Application No. 0502538-2, filed 18 Nov. 2005, titled "Electrode and Method of Forming the Master Electrode," and claimed priority to Swedish Application No. 0502539-0, filed 18 Nov. 2005, titled "Electrode and Method of Forming the Master Electrode," all of which are hereby incorporated by reference for all purposes as if fully set forth herein.

BACKGROUND

1. Field of the Invention

The present invention relates to a master electrode and a method of forming the master electrode. The master electrode is useable in an etching or plating method as described in a copending Swedish patent application No. 0502538-2 filed concurrently herewith and entitled "METHOD OF FORMING A MULTILAYER STRUCTURE". The content of this patent specification is incorporated herein by reference. The master electrode is suitable for enabling production of applications involving micro and nano structures in single or multiple layers. The master electrode is useful for fabrication of PWB (printed wiring boards), PCB (printed circuit boards), MEMS (micro electro mechanical systems), IC (integrated circuit) interconnects, above IC interconnects, sensors, flat panel displays, magnetic and optical storage devices, solar cells and other electronic devices. Different types of structures in conductive polymers, structures in semiconductors, structures in metals, and others are possible to produce using this master electrode. Even 3D-structures in silicon, such as by using formation of porous silicon, are possible to produce.

2. Description of Related Art

WO 02/103085 relates to an electrochemical pattern replication method, ECPR, and a construction of a conductive master electrode for production of appliances involving micro and nano structures. An etching or plating pattern, which is defined by a master electrode, is replicated on an electrically conductive material, a substrate. The master electrode is put in close contact with the substrate and the etching/plating pattern is directly transferred onto the substrate by using a contact etching/plating process. The contact etching/plating process is performed in local etching/plating cells, which are formed in closed or open cavities between the master electrode and the substrate.

The master electrode is used for cooperation with a substrate, onto which a structure is to be built. The master electrode forms at least one, normally a plurality of electrochemical cells in which etching or plating takes place.

The master electrode may be made of a durable material, since the master electrode should be used for a plurality of processes of etching or plating.

A problem is that the master electrode is to be arranged in a carefully adjusted position on the substrate in order for the pattern to be aligned with previous structures on the substrate.

A further problem is that the master electrode is to be arranged in close proximity of a substrate when said substrate comprises topography.

A yet further problem is that the etching rate or plating rate may be higher in the electrochemical cells located closer to the contact area of the seed layer, such as in the perimeter, than in other areas.

Further problems are mentioned below.

DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

FIG. 7(*c*) is a schematic cross-sectional view and FIGS. 7(*d*) to 7(*e*) are top views of a master electrode provided with one or several recesses;

FIGS. 7(*f*) to 7(*i*) are schematic cross-sectional views of a master electrode provided with contact areas to a substrate;

FIGS. 8(*a*) to 8(*h*) are schematic cross-sectional views of a carrier having different types of edge recesses;

FIGS. 12(*b*) to 12(*d*) are cross-sectional views of master electrodes with different radial height distribution of plated structures;

FIGS. 20(*b*) to 20(*d*) are schematic cross-sectional views showing the use of the embodiment of the master electrode of FIG. 20(*a*);

FIG. 23(*b*) is a schematic cross-sectional view showing how an anode material, being predeposited onto a conducting electrode layer of an electrode, is dissolved in electrochemical cells and said conducting electrode layer being intact.

Figure 1A:
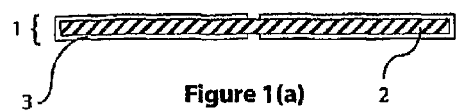
FIGS. 1(*a*) to 1(*d*) are schematic cross-sectional views of several method steps in forming a master electrode from a conducting or semiconducting carrier.
Figure 2A:
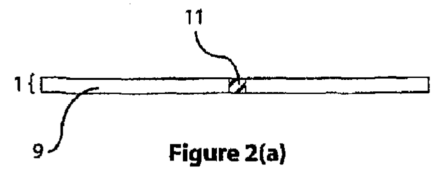
FIGS. 2(*a*) to 2(*d*) are schematic cross-sectional views of several method steps in forming a master electrode from a non-conducting carrier.
Figure 1B:
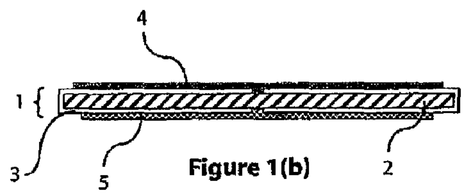
Figure 2B:
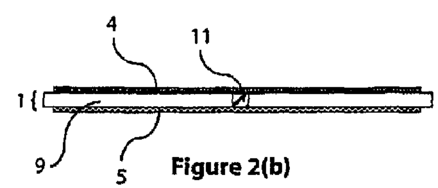
Figure 1C:
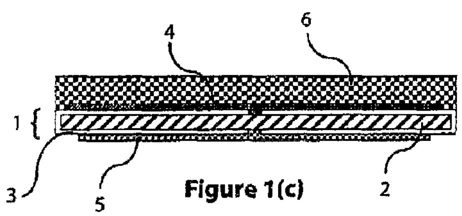
Figure 2C:
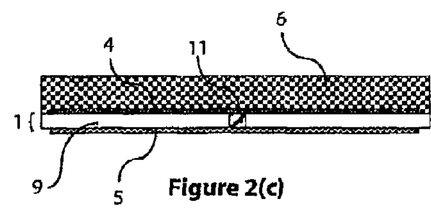
Figure 1D:
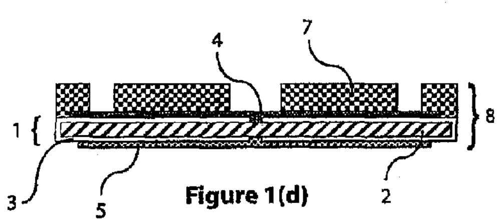
Figure 2D:
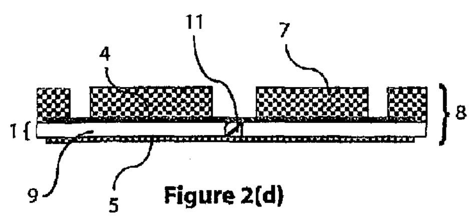

While the systems and methods of the present application is susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the present application.

SUMMARY OF THE INVENTION

An object of the present invention is to provide an electrode in which the above-mentioned problems are at least partly eliminated or alleviated.

Another object is to provide a master electrode that can be used for several processes of etching or plating.

A further object is to provide a master electrode that may be adjusted in relation to a previous structure on a substrate.

A further object is to provide a master electrode that enables improved etching or plating rate uniformity in the electrochemical cells independent of where the cells are located with respect to the contact area of the seed layer.

A further object is to provide a master electrode that can be arranged in close proximity of a substrate, which comprises topography.

According to an aspect of the invention, there is provided a method of forming a master electrode, comprising: providing a disc having a front surface and a back surface being of a conducting or semiconducting material; forming an insulating coating layer circumscribing at least a part of the disc; forming a conducting electrode layer of an electrode forming, conducting material on at least a part of the front surface, said conducting electrode layer being in electrical connection with said disc via at least one opening in the insulating coating layer; forming an insulating pattern layer comprising at least one cavity on said conducting electrode layer. The method may further comprise: forming a contact layer of a conducting material on at least a part of the back surface, said contact layer being in electrical connection with said disc via at least one opening in the insulating coating layer.

In another aspect, there is provided a method of forming a master electrode, comprising: providing a insulating disc having a front surface and a back surface and being of an insulating material; forming a connection via in said insulating disc of a conducting material; forming an electrode layer of a conducting material on at least a part of the front surface, said electrode layer being in electrical connection with said via; forming an insulating pattern layer comprising at least one cavity on said electrode layer. The method may further comprise: forming a contact layer of a conducting material on at least a part of the back surface, said contact layer being in electrical connection with said via.

In a further aspect, there is provided a method of forming a master electrode, comprising: providing a disc of at least one layer of a conducting and/or semiconducting material; forming an insulating layer at least partly of at least one layer of an insulating material; forming at least one recesses in said insulating material; forming a conducting electrode layer of an electrode forming, conducting material in each recess; and forming at least one recess at the back side of said insulating layer. The method may further comprise: forming a connection layer of at least one layer of a conducting and/or semi-conducting material in electrical contact with said disc and said electrode layer at the back side of said insulating layer. The method may further comprise: applying at least another conducting layer.

In yet an aspect, there is provided a method of forming a master electrode, comprising: providing a carrier of at least one layer of a conducting and/or semi-conducting material; providing several recesses in said layer of a conducting and/or semi-conducting material; providing at least one layer of an insulating layer between the recesses. The method may further comprise: providing at least one layer of a conducting electrode layer at a bottom surface of said at least one recess. The method may further comprise: providing at least one layer of an insulating material at a back side of said carrier; and providing at least one recess in said insulating material forming a connection. The method may further comprise: providing at least one conducting electrode layer is said recess of the insulating material. The method may further comprise: providing at least one layer of an insulating material at side surfaces of said at least one recess. The method may further comprise: applying insulating material covering substantially all surfaces of the front-side of the carrier; and removing the insulating material from said bottom surfaces of the recesses in the carrier.

The insulated material may be applied by a method selected from the group comprising: thermal oxidation, thermal nitridation, sputtering, PECVD and ALD. The insulated material may be removed by anisotropic etching, such as dry-etching, having a higher etch rate in a direction normal to said bottom surfaces than in a direction normal to said side surfaces of the recesses. The insulated material may be removed from the bottom surfaces of the recesses by lithography and etching.

In an embodiment, the method may further comprise: forming said at least one recess in said carrier by using said insulating material layer as an etch-mask. At least one layer of a further insulating material may be arranged above said insulating layer.

In a still other aspect, there is provided a master electrode for forming an electrochemical cell with a substrate, comprising: a carrier at least partly of a conducting material; an insulating pattern layer at least partly of at least one layer of an insulating material and arranged substantially at a front surface of said carrier and comprising at least one cavity; wherein said carrier comprises: a disc of a at least one layer of conducting or semi-conducting material provided with an insulating coating layer; and at least one conducing electrode layer of an electrode forming material and at least partly covering a front surface of the disc and being in electric contact with said disc. The carrier may comprise: a connection portion of at least one layer of a conducting material and covering at least a portion of the backside surface of the disc and/or being in electric contact with said disc and said electrode layer. The insulating coating layer may cover all parts of conducting or semiconducting material in said disc except for in the center parts of the backside and the front-side of said disc. The insulating coating layer may selectively cover specific parts of said disc or covers substantially all of the conducting or semiconducting layers of said disc and wherein parts of the insulating material coating is removed in selected areas, for instance by etching methods, such as wet-etching or dry-etching methods; or by mechanical abrasive methods.

In a still another aspect, there is provided a master electrode for forming an electrochemical cell with a substrate, comprising: a carrier at least partly of at least one layer of a conducting and/or semi-conducting material; an insulating pattern layer at least partly of at least one layer of an insulating material and arranged substantially at a front surface of said carrier; wherein said carrier comprises: a disc of at least one layer of an insulating material, which is possibly transparent; an conducting electrode layer of at least one layer of an electrode forming material and covering at least a part of a front surface of the disc; a via layer of at least one layer of a conducting material and being in electrical contact with said electrode layer. A connection layer may be in electric contact with said via layer and electrode layer. The connection layer may comprise at least one layer of a conducting material covering at least a portion of a backside surface of the disc. The disc may comprise at least one layer of an insulating material, which is possibly transparent, in which at least some parts of the disc comprises a conducting or semiconducting material. The conducting or semiconducting parts may be applied in the center of said insulating disc.

In a yet other aspect, there is provided a master electrode for forming an electrochemical cell with a substrate, comprising: a disc of at least one layer of a conducting and/or semi-conducting material; an insulating layer at least partly of at least one layer of an insulating material; said insulating pattern layer at a front side thereof being provided with at least one recess, each being provided with a conducting electrode layer of an electrode forming, conducting material; said insulating layer at a back side being provided with at least one recess. The insulating layer may be arranged substantially surrounding said disc. The recess on the back side of said insulating layer may be provided with a connection layer comprised of at least one layer of a conducting and/or semi-conducting material being in electrical contact with said disc and said electrode layer. The master electrode may further comprise at least another conducting layer.

In a yet another aspect, there is provided a master electrode for forming an electrochemical cell with a substrate, comprising: a carrier of at least one layer of a conducting and/or semi-conducting material, said carrier at a front side being provided with several recesses and at least one layer of an insulating layer being arranged between the recesses. Each recess in said at least one layer of a conducting and/or semi-conducting material may comprise a bottom surface and side surfaces, and said side surfaces being provided with at least one layer of an insulating material. The bottom surface may be provided with at least one layer of a conducting electrode layer of an electrode forming, conducting material.

In an embodiment, the carrier may be made from at least one layer of a conducting and/or semi-conducting material and may be provided with an conducting electrode layer of a electrode forming, conducting material in cavities of said insulating pattern layer. The carrier may be made from at least one layer of a conducting and/or semi-conducting material; recesses being provided in said front surface for forming a pattern, wherein insulating material is arranged covering the areas between the recesses and wherein conducting electrode layer (4) is arranged in the bottom surfaces of said recesses.

In an embodiment, the master electrode may be provided with recesses for arranging contacts for the substrate. Contacts means may be arranged for engagement with a substrate surface when the electrode is applied to said substrate for forming electrical contact with said substrate surface. The contact means may be arranged at the peripheral surface of the carrier outside said insulating material.

In an embodiment, the disc may be made from an elastic and/or flexible material. The front surface of the insulating pattern layer may be provided with formations corresponding to a three-dimensional structure of a substrate to be contacted.

In an embodiment, the sidewalls of the cavities of the insulating pattern layer may be arranged with an inclination in relation to the normal to the front surface.

In an embodiment, an anode material is predeposited in cavities of the insulating pattern layer in contact with said conducting electrode layer. The anode material may be predeposited with a method selected from the group comprising: electroplating, electroless plating, immersion plating, CVD, MOCVD, (charged) powder-coating, chemical grafting, electrografting, and combinations thereof. The method for depositing said anode material may be electroplating or electroless plating.

In an embodiment, the layers of said carrier may be flexible for compensating for waviness or unevenness of a substrate, for giving a contact between said insulating pattern layer and said substrate surface, when the master electrode is pressed against the substrate. The layers of said carrier may be rigid for avoiding bending down into the cavities of said insulating pattern layer when applying a force for putting said master electrode in contact with a substrate. The bending of the carrier may be less than 50%, such as less than 25%, for instance less than 10%, for example less than about 1%. The carrier may have the substantially the same or higher flexibility as a glass, quartz or silicon wafer.

In an embodiment, the at least one layer of conducting and/or semiconducting material may be selected from the group comprising: conducting polymers, conducting paste, metals, Fe, Cu, Au, Ag, Pt, Si, SiC, Sn, Pd, Pt, Co, Ti, Ni, Cr, Al, Indium-Tin-Oxide (ITO), SiGe, GaAs, InP, Ru, Ir, Re, Hf, Os, Rh, alloys, phosphorous-alloys, SnAg, PbAg, SnAgCu, NiP, AuCu, silicides, stainless steel, brass, solder materials and combinations thereof. The at least one layer of conducting material may be a metal selected from the group comprising: Cr, Ti, Au, Pt. The at least one layer of conducting material may comprise Au or Pt. The at least one layer of semiconducting material may be Si. The insulating material may be selected from the group comprising: oxides such as SiO.sub.2, quartz, glass, nitrides such as SiN, polymers, polyimide, polyurethane, epoxy polymers, acrylate polymers, PDMS, (natural) rubber, silicones, lacquers, elastomers, nitrile rubber, EPDM, neoprene, PFTE, parylene and combinations thereof. The insulating material may be applied with a method selected from the group comprising: thermo-oxidation, Plasma-Enhanced-Chemical-Vapor Deposition (PECVD), Physical Vapor Deposition (PVD), Chemical-Vapor-Deposition (CVD), electrical anodization, Atomic-Layer-Deposition (ALD), spin-coating, spray-coating, roller-coating, powder-coating, adhesive taping, pyrolysis, bonding and combinations thereof.

In an embodiment, the wet-etching or dry-etching methods may comprise using an etch-mask, which is applied onto a surface, which is not to be etched. The etch-mask may be patterned with a lithography method.

In an embodiment, a planarization step may be performed on said carrier. The conducting electrode layer may comprise at least one layer of conducting and/or semiconducting material selected from the group comprising: Fe, Cu, Sn, Ag, Au, Pd, Co, Ti, Ta, Ni, Pt, Cr, Al, W, ITO, Si, Ru, Rh, Re, Os, Hf, Ir, Nb, other metals, alloys, phosforous-alloys, SnAg, SnAgCu, CoWP, CoWB, CoWBP, NiP, AuCu, silicides, graphite, stainless steel, conducting polymers, solder materials, conducting or semiconducting oxides or mixed oxides, such as mixtures of oxides of above mentioned metals, such as Ru, Ir, Rh, Ti and/or Ta oxides. The conducting electrode layer may be applied with methods selected from the group comprising: ALD, Metallorganic-Chemical-Vapor-Deposition (MOCVD), PVD, CVD, sputtering, electroless deposition, immersion deposition, electrodeposition, electro-grafting, chemical grafting and combinations thereof. The conducting electrode layer may be applied by using a combination of PVD/sputtering and electroless/immersion deposition. The conducting electrode layer may be treated by thermal methods. The thermal methods may be annealing, such as rapid-thermal-annealing (RTA), furnace heating, hot-plate heating or combinations thereof; wherein said methods may be performed in an environment which substantially comprises: vacuum, forming gas, hydrogen gas, nitrogen gas, low oxygen content or combinations thereof.

In an embodiment, the conducting electrode layer may be formed by applying several layers of at least one material and by treating at least one layer by said thermal methods before applying a next layer. An adhesion layer may be applied onto at least some parts of the carrier prior to applying said conducting electrode layer; wherein said adhesion layer may be comprised of one or several materials that increase the adhesion of the conducting electrode layer to said carrier. The insulating pattern layer may be comprised of one or several layers of an electrically insulating material, which is pattered by being provided with several recesses. The insulating pattern layer may have a low surface roughness and high thickness uniformity.

In an embodiment, the at least one electrically insulating layer of said insulating pattern layer may be is applied using a method selected from the group comprising: thermal oxidation, thermal nitridation, PECVD, PVD, CVD, MOCVD, electrochemical anodization, ALD, spin-coating, spray-coating, dip-coating, curtain-coating, roller-coating, powder-coating, pyrolysis, adhesive taping, bonding and combinations thereof. An adhesion layer may be arranged onto at least some parts of said carrier prior to arranging said insulating pattern layer; wherein said adhesion layer may comprise at least one layer of material that improves the adhesion properties between the insulating pattern layer and the carrier. The adhesion layer may be comprised of at least one layer of a material selected from the group comprising: conducting materials such as Pt, Al, Ni, Pd, Cr, Ti, TiW; insulating materials such as AP-3000, AP-100, AP-200, AP-300, silanes such as HMDS and combinations thereof. The adhesion layer may be applied using deposition methods selected from the group comprising: electrodeposition, spin-coating, spray-coating, dip-coating, Molecular-Vapor-Deposition (MVD), ALD, MOCVD, CVD, PVD, sputtering, electroless deposition, immersion deposition, electrografting, chemical grafting and combinations thereof.

In an embodiment, a planarization step may be performed on the arranged insulating pattern layer. The planarization step may be performed by a method selected from the group comprising: etching and/or polishing methods such as chemical-mechanical-polishing (CMP), lapping, contact planarization (CP) and/or dry etching methods such as ion-sputtering, reactive-ion-etching (RIE), plasma-assisted-etching, laser-ablation, ion-milling; and combinations thereof. The electrically insulating material may be selected from the group comprising: organic compounds, polymers, insulating in-organic compounds, oxides, nitrides, polyimide, siloxane modified polyimide, BCB, SU-8, polytetrafluoroethylene (PTFE), silicones, elastomeric polymers, E-beam resists such as ZEP, photoresists, thinfilm resists, thickfilm resists, polycyclic olefins, polynorborene, polyethene, polycarbonate, PMMA, BARC materials, Lift-Off-Layer (LOL) materials, PDMS, polyurethane, epoxy polymers, fluoro elastomers, acrylate polymers, (natural) rubber, silicones, lacquers, nitrile rubber, EPDM, neoprene, PFTE, parylene, fluoromethylene cyanate ester, inorganic-organic hybrid polymers, fluorinated or hydrogenated amorphous carbon, organic doped silicon glass (OSG), fluorine doped silicon glass (FSG), PFTE/silicon compound, tetraethyl orthosilicate (TEOS), SiN, SiO.sub.2, SiON, SiOC, SiCN:H, SiOCH materials, SiCH materials, silicates, silica based materials, silsesquioxane (SSQ) based material, methyl-silsesquioxane (MSQ), hydrogen-silsesquioxane (HSQ), TiO.sub.2, Al.sub.2O.sub.3, TiN and combinations thereof. The recesses in said insulating pattern layer may be formed by using lithography, etching methods and/or mechanical abrasive methods. The etching methods may comprise wet-etching and/or dry-etching. The dry-etching methods may comprise: ion-sputtering, reactive-ion-etching (RIE), plasma-assisted-etching, laser-ablation, ion-milling or combinations thereof. The etching methods may comprise arranging a patterned etch-mask onto at leas some areas of said insulating pattern layer, said areas being protected from etching. The patterned etch-mask may be produced by said lithography and/or etching methods. The etch-mask may be comprised of a polymer resist used in said lithographical methods such as a thinfilm photoresist, polyimide, BCB, a thick film resist and/or other polymers and the like; or a hard-mask comprising material such as SiN, SiO.sub.2, SiC, Pt, Ti, TiW, TiN, Al, Cr, Au, Cu, Ni, Ag, NiP; or combinations thereof. The hard mask may be applied with methods selected from the group comprising: PVD, CVD, MOCVD, sputtering, electroless deposition, immersion deposition, electrodeposition, PECVD, ALD and combinations thereof. The etch-mask may comprise at least one structure layer being formed in said at least one electrochemical cell formed by a further master electrode.

In an embodiment, the structure layer may be comprised of at least one material selected from the group comprising: Cu, Ni, NiFe, NiP Au, Ag, Sn, Pb, SnAg, SnAgCu, SnPb and combinations thereof. An etch-stop layer may be applied prior to applying said insulating pattern layer. The etch-stop layer may be formed by at least one layer of a material selected from the group comprising: Ti, Pt, Au, Ag, Cr, TiW, SiN, Ni, Si, SiC, SiO2, Al, InGaP, CoP, CoWP, NiP, NiPCo, AuCo, BLOk™ and combinations thereof.

In an embodiment, the patterning method for forming said insulating pattern layer may be modified in order to affect the angle of inclination for the cavity sidewalls in the insulating pattern layer. The cavity sidewalls of said insulating pattern layer may be close to vertical, whereby the sidewalls have an angle to the normal of the said conducting electrode surface of less than about 45.degree., such as less than about 20.degree., such as less than about 5.degree., such as less than about 2.degree., such as less than about 1.degree., such as less than about 0.1.degree. The angle inclination may be optimized by varying parameters in a photolithographic patterning method, such as using wavelength filters, using anti-reflective coatings, modifying the exposure dose, modifying the development time, using thermal treatment and/or combinations thereof. A specific angle of inclination may be obtained by optimizing the gas composition, platen power (RF power) and/or plasma power (also called coil power) for dry-etching methods such Reactive-Ion-Etching (RIE).

In an embodiment, a damascene process may be used to create the cavities of said insulating pattern layer; said damascene process may involve applying a sacrificial pattern layer, having recesses, onto the carrier; applying an insulating material so that it cover said sacrificial pattern layer as well as fills up the recesses of the sacrificial pattern; planarizing said insulating material until the sacrificial pattern layer is uncovered; and removing said sacrificial pattern layer whereby an insulating pattern layer is formed. The sacrificial pattern may be arranged by applying a material, which is patterned by lithography, plating and/or etching methods. The sacrificial pattern layer may comprise at least one structure layer being formed in an electrochemical cell with a further master electrode.

In an embodiment, the method may further comprise a coating of a release layer onto at least some parts of the insulating pattern layer; wherein said release layer lowers the mechanical and chemical bond between the insulating pattern layer and other materials being put in contact with said layer. The release layer may be applied using spin-coating, spray-coating, CVD, MOCVD, MVD, PVD and/or by combinations thereof; and formed of materials selected from the group comprising: silanes such as methoxy-silanes, chloro-silanes, fluoro-silanes, siloxanes such as poly-di-methyl-siloxane, poly-ethylane-glycol-siloxanes, dimethyl-siloxane oligomer (DMS) and/or other polymers such as amorphous fluoro-polymers, fluoro-carbons poly-tetra-fluoro-ethylen (PTFE), Cyto-fluoro-polymers and combinations thereof. The surfaces forming said at least one electrochemical cell may have surface properties that have good wetting ability of the electrolyte used in said electrochemical cell. The surfaces forming said at least one electrochemical cell may be hydrophilic, having a low contact angle with aqueous solutions. At least some surfaces of said insulating pattern layer may have been treated with methods that lower the surface energy, creating hydrophilic surfaces. At least some surfaces of said insulating pattern layer may have been treated with thermal treatment, oxygen/nitrogen/argon plasma treatment, surface conversion for anti-sticking (SURCAS), strong oxidizing agents such as peroxides, persulfates, concentrated acids/bases or combinations thereof. At least some parts of the insulating pattern layer may have high surface energy or is treated with methods, such as hydrogen plasma, in order to increase the surface energy, making the surface hydrophobic. The insulating pattern layer may comprise one or several layers of at least one material having properties such that the side-walls of the cavities of the insulating pattern layer are hydrophilic and the top of the insulating pattern layer are hydrophobic. The hydrophilic material may be selected from the group comprising: SiN, SiO.sub.2, polymers (such as photoresists and/or elastomers) that have been treated with oxygen plasma and/or other materials with polar functional molecule groups at the surface and combinations thereof; and said hydrophobic materials are selected from the group comprising: materials with non-polar functional molecule groups such as hydrogen terminated polymers, Teflon, fluoro- and chloro-silanes, siloxanes, fluoro-elastomers and combinations thereof.

In an embodiment, the insulating pattern layer may comprise one or several layers of at least one material, which improves the mechanical contact between the top of the insulating pattern layer surface and an intended substrate when the master electrode is pressed against said substrate. The insulating pattern layer may be comprised of at least one layer a flexible material such an elastomer; or at least one layer of rigid material and at least one layer of a flexible material. The at least one layer of flexible materials may be arranged on top of said at least one layer of rigid material. The flexible material may be an elastomer; said elastomer having properties selected from the group comprising: having high compressibility; elastic properties; electrically insulating; low dielectric properties; good chemical resistance; strong adhesion to underlying layers such as metals, silicon, glass, oxides, nitrides and/or polymers; have high resistance against shrinking or swelling over time and/or; be non-bleeding, meaning not releasing contaminating organic compounds; sensitive to UW-light; being patterned with lithography methods; being transparent; being patterned by using etching methods, such as by dry-etching methods; and combinations thereof. The elastomer is a material selected from the group comprising: Poly-Di-Methyl-Siloxane (PDMS), silicones, epoxy-silicones, fluoro-silicones, fluoro-elastomers, (natural) rubber, neoprene, EPDM, nitrile, acrylate elastomers, polyurethane and combinations thereof. The elastomer may have a tensile elastic modulus (Young's modulus) less than 0.1 GPa, such as less than 1 MPa, for example less than about 0.05 MPa; or said elastomer layer have a hardness of less than 90 Shore-A, such as less than 30 Shore-A, for example less than about 5 Shore-A.

In an embodiment, the carrier or disc may have a circular shape. The carrier or disc may alternatively have a rectangular shape. The carrier or disc may be provided with recesses in the same region as the recesses of the insulating pattern layer; said recesses of the carrier may be provided with a conducting electrode layer. The insulating pattern layer may be provided by bonding and patterning a bond-layer of an insulating material onto said carrier. The bond-layer may be provided with a bond-carrier, which can be removed after the bonding. The bond-layer may be SiO-.sub.2, glass, quartz or a polymer film. The bond-layer may be provided with an adhesive bond-layer. The bond-carrier may be removed after bonding using mechanical methods, such as grinding or polishing, or etching methods, such as wet- or dry-etching.

In an embodiment, the master electrode may have a front-side area, which is substantially the same as the front side area of said substrate. The master may be provided with connection sites being recesses or holes that allow for an external electrical connection to a substrate. The carrier or disc may be provided with at least one recess in the perimeter. The carrier or disc may be provided with connection holes in the perimeter of close to the perimeter.

In an embodiment, the connection sites may be located so as to give a uniform current density distribution when forming an electrochemical cell with the substrate. The master electrode may be provided with an electrical seed layer connection of a conducting, electrode forming material and being arranged in at least some parts between the recesses on top of said insulating pattern layer. The electrical seed layer connection may be electrically isolated by an insulating material from the conducting or semiconducting materials of the carrier, disc, conducting electrode layer or connection layer. The electrical seed layer connection may be provided as a layer around the edge of the carrier or disc. The electrical seed layer connection may be arranged over a large surface of the insulating pattern layer and substantially over the entire surface, except adjacent the edges to the cavities of the pattern layer. The different portions of said electrical seed layer connection may be provided with connection areas at the backside of the carrier and through the carrier.

In an embodiment, the master electrode further comprises means for reducing an edge bead, which is formed when applying, said insulating pattern layer with methods such as spin-coating or spray-coating. The carrier or disc may be provided with a recess in the perimeter. A spin-carrier may be used when applying the insulating pattern layer and the spin-carrier may be provided with a recess in which the carrier is embedded. The edge-bead may be removed by using methods such as dissolving in organic solvents, mechanical removing and/or by removing insulating pattern layer edge-bead area by lithographical and/or etching methods.

In an embodiment, the master electrode may further comprise alignment marks, for aligning said master electrode to a substrate; said alignment marks comprising structures or cavities in a layer on the front-side and/or backside of the master electrode. The alignment marks may be provided in said carrier, conducting electrode layer and/or in said insulating pattern layer.

In an embodiment, the carrier may be transparent in the light used for alignment, such as ultra-violet light, infra-red light or X-rays, and where the insulating pattern layer is provided with the alignment marks. The conducting electrode layer may be of a non-transparent material and may be provided with openings in regions where the alignment marks in the insulating pattern layer are located. The conducting material may be transparent in the light used for alignment. The insulating pattern layer may be of a non-transparent material and may be provided with openings in regions where alignment marks are arranged in the carrier or conducting electrode layer. The alignment marks may comprise a material, which is non-transparent and is located onto a portion of otherwise transparent materials, such as metal onto quartz. The alignment marks may be provided on the backside; and wherein the pattern of the insulating patter layer is aligned relative to the alignment marks when arranged on the front-side; or where the alignment marks are aligned to the pattern of the insulating pattern layer when arranged on the backside. The alignment marks may be arranged on the front-side, for the use of a face-to-face alignment method. The alignment marks may be arranged in the insulating pattern layer or conducting electrode layer on the front-side; and the carrier is provided with through-holes in the areas where the alignment marks are located making the alignment marks on the front-side visible from the back-side. A transparent material may be arranged in said through-holes.

In an embodiment, the substrate may comprise topography in at least some parts and the insulating patter layer and may be arranged with a pattern that compensates for or is adapted to said topography. The insulating pattern layer may be provided with at least one cavity in regions corresponding to an area with topography on said substrate when the master electrode and substrate are put into close contact for forming at least one electrochemical cell. The at least one cavity corresponding to an area with topography may be less deep than the other recesses of the insulating pattern layer and said at least one cavity corresponding to an area with topography lacks a conducting electrode layer. The insulating pattern layer may be provided with cavities of different heights, by patterning the insulating pattern layer more than once. The insulating pattern layer may be formed using said lithographical and/or etching methods, creating cavities reaching down to the carrier or conducting electrode and the insulating pattern layer may be patterned once more in at least some areas, creating cavities that compensate for topography on the substrate but do not reach the carrier or conducting electrode layer. The insulating pattern layer may be patterned using said lithographical and/or etching methods creating cavities that compensate for topography on the substrate but do not reach the carrier or conducting electrode layer below and the insulating pattern layer is patterned once more to create the cavities that reach the carrier or conducting electrode layer below. The insulating pattern layer may comprise at least two layers of an insulating material and at least one etch-stop layer; and further performing a patterning sequence at least once, wherein said sequence comprise: etching down cavities in a top insulating pattern layer down to the etch-stop layer; removing portions of the etch-stop layer using said lithographical and etching methods; and etching another layer of cavities in underlying insulating pattern layer using said patterned etch-stop layer as an etch-mask down to an underlying etch-stop layer, carrier or conducting electrode layer. The cavities of the insulating pattern layer may be created as an imprint of a substrate template having the same or substantially the same topography as the substrate surface and said insulating pattern layer is patterned, creating cavities down to the underlying carrier or conducting electrode layer. The insulating pattern layer may be arranged by at least once performing a sequence comprising: applying a layer of negative photoresist and/or a UV-curing polymer; exposing said layer to UV-light through a photomask; applying a further layer of photoresist and/or a UV-curing polymer; exposing said second layer to UV-light through a further photomask; and if necessary, performing an post-exposure-bake (PEB) step prior to developing both layers simultaneously. The sequence may comprise using direct write methods such as laser-beam or E-beam exposure instead of exposing said layers with UV-light through a photomask. The insulating pattern layer may be patterned by repeating said lithography and/or etching steps and thereby creating multiple levels of cavities so as to compensate for multiple levels of topography of different heights and shapes on a substrate. The at least one cavity, which is adapted to said topography, may be sufficiently large for enclosing the topography inside said cavity with some margin. The carrier of the master electrode may be provided with recess in at least one cavity of an insulating pattern layer; said recess being coated on the walls with a conducting electrode layer; and a predeposited anode material is arranged onto said conducting electrode layer. The carrier and the conducting electrode layer may exert a protruding structure in at least one cavity of an insulating pattern layer; and a predeposited anode material is arranged onto said conducting electrode layer.

DETAILED DESCRIPTION OF THE PREFERRED EMBODIMENT

Below, several embodiments of the invention will be described with references to the drawings. These embodiments are described in illustrating purpose in order to enable a skilled person to carry out the invention and to disclose the best mode. However, such embodiments do not limit the invention, but other combinations of the different features are possible within the scope of the invention.

Some general remarks are given below with regard to the master electrode and methods of forming the master electrode. Several methods are described for forming a master electrode that can be used for producing one or multiple layers of structures of one or multiple materials including using an electrochemical pattern replication (ECPR) technology described below. The methods generally include: forming a master electrode that comprises a carrier which is conducting/semiconducting in at least some parts; forming a conducting electrode layer which functions as anode in ECPR plating and cathode in ECPR etching; and forming an insulating pattern layer that defines the cavities in which ECPR etching or plating can occur in the ECPR process; in a way that makes possible electrical contact from an external power supply to the conducing parts of the carrier and/or to the conducting electrode layer.

The master electrode is to be used for producing one or multiple layers of structures using the electrochemical pattern replication (ECPR) technology including the following three steps, namely:

a) putting a master electrode in contact with the substrate, such as a seed layer, to form multiple electrolytic cells;

b) forming structures in said seed layer by etching or forming structures on said seed layer by plating; and c) separating said master electrode from said substrate.

In a first step (a) a master electrode comprising an electrically conducting electrode layer, of at least one an inert material, such as platinum, and an insulating pattern layer, is put in close physical contact with the conducting top layer or seed layer, on the substrate in the presence of an electrolyte, forming electrochemical cells, filled with electrolyte, defined by the cavities of the insulating structures on the master.

Said seed layer can comprise one or several layers of metals such as Ru, Os, Hf, Re, Rh, Cr, Au, Ag, Cu, Pd, Pt, Sn, Ta, Ti, Ni, Al, alloys of these materials, Si, other materials such as W, TiN, TiW, NiB, NiP, NiCo NiBW, NiM-P, W, TaN, Wo, Co, CoReP, CoP, CoWP, CoWB, CoWBP, conducting polymers such as polyaniline, solder materials such as SnPb, SnAg, SnAgCu, SnCu alloys such as monel, permalloy and/or combinations thereof. The seed layer of the substrate can be cleaned and activated before usage in the ECPR process. The cleaning method can include the use of organic solvents e.g. acetone or alcohols; and/or inorganic solvents e.g. nitric acid, sulfuric acid, phosphoric acid, hydrochloric acid, acetic acid, hydrofluoric acid, strong oxidizing agents, e.g. peroxides, persulfates, ferric-chloride, and/or de-ionized water. Cleaning can also be performed by applying oxygen plasma, argon plasma and/or hydrogen plasma or by mechanically removing impurities. Activation of the seed layer surface can be performed with solutions removing oxides, e.g. sulfuric acid, nitric acid, hydrochloric acid, hydrofluoric acid, phosphoric acid and etchants, e.g. sodium-persulfate, ammonium-persulfate, hydrogen-peroxide, ferric-chloride and/or other solutions comprising oxidizing agents.

Putting the master electrode in close contact with the top layer on the substrate includes aligning the master electrode insulating pattern to the patterned layer on the substrate. This step can include the use of alignment marks on the front side or backside of the master electrode that can be aligned to the corresponding alignment marks on the substrate. The alignment procedure can be performed before or after applying the electrolyte. Predeposited anode material may previously be arranged onto said conducting electrode layer in the cavities of the insulating pattern layer prior to putting the master in contact with a substrate. Predeposited anode material in the master electrode cavities can be cleaned and activated in advance, in the same manner as described for the substrate seed layer, before putting the master into contact with the substrate.

Said electrolyte comprises a solution of cations and anions appropriate for electrochemical etching and/or plating, such as conventional electroplating baths. For instance, when the ECPR etched or plated structures are copper, a copper sulphate bath can be used, such as an acidic copper sulphate bath. Acidic may include a pH<4, such as between pH=2 and pH=4. In some embodiments, additives can be used, such as suppressors, levellers and/or accelerators, for instance PEG (poly-ethylene glycol) and chloride ions and/or SPS (bis(3-sulfopropyl) disulfide). In another example, when the ECPR etched or plated structures are Ni, a Watt's bath can be used. Appropriate electrolyte systems for different materials of ECPR etched or plated structures are described in: Lawrence J. Durney, et. al., Electroplating Engineering Handbook, 4th ed., (1984).

In a second step (b) structures of conducting material are formed using ECPR etching or plating by applying a voltage, using an external power source, to the master electrode and to the seed layer on the substrate for creating an electrochemical process simultaneously inside each of the electrochemical cells defined by the cavities of the master electrode and the top layer on the substrate. When the voltage is applied in such a manner that the seed layer on the substrate is anode and the conducting electrode layer in the master electrode is cathode, the seed layer material is dissolved and at the same time material is deposited inside the cavities of the master electrode. The grooves created by dissolving the seed layer separate the remaining structures of the seed layer. The structures formed from the remaining seed layer is a negative image of the cavities of the insulating pattern layer of the master electrode; and these structures are referred to as "ECPR etched structures" below in this specification. When the voltage is applied in such a manner that the conducting electrode layer in the master electrode is anode and the seed layer of the substrate is cathode, the predeposited anode material inside the cavities of the master electrode is dissolved and at the same time material is deposited on the conducting layer on the substrate in the cavities that are filled with electrolyte. The deposited material on the conducting layer on the substrate forms structures that are a positive image of the cavities of the insulating pattern layer of the master electrode; and these structures are referred to as "ECPR plated structures" below in this description.

Said ECPR etched or ECPR plated structures can be comprised of conducting materials, such as metals or alloys, for instance Au, Ag, Ni, Cu, Sn, Pb and/or SnAg, SnAgCu, AgCu and/or combinations thereof, for example Cu.

In one embodiment, said anode material is predeposited in the cavities of the master electrode by using ECPR etching of a material, which is anode, and depositing said material onto the conducting electrode, which is cathode, in the cavities of the insulating pattern layer of the master electrode. In other embodiments, said anode material is predeposited by regular electroplating, electroless plating, immersion plating, CVD, MOCVD, (charged) powder-coating, chemical grafting and/or electrografting said material selectively onto the conducting electrode layer in the cavities of the insulating pattern layer of the master electrode.

The voltage can be applied in a manner that improves the uniformity and/or properties of the etched and/or plated structures. The applied voltage can be a DC voltage, a pulsed voltage, a square pulsed voltage, a pulse reverse voltage and/or a combination thereof.

The uniformity of the etched and/or plated structures can be increased by choosing an optimized combination of applied voltage waveform, amplitude and frequency. The etch depth or plating height can be controlled by monitoring the time and the current passing through the master electrode. If the total electrode area is known, the current density can be predicted from the current passing through the electrode area. The current density corresponds to an etching or plating rate and hence the etching depth or plating height can be predicted from the etching or plating rate and time.

In some embodiments, the etching or plating process is stopped by disconnecting the applied voltage before reaching the underlying surface of the dissolving anode material. For the etching process, this means that the process is stopped when a layer is still remaining in the bottom of the etched grooves in the seed layer, covering the underlying substrate layer. Otherwise, there is a risk that the electric connection to certain portions of the seed layer may be broken. For the plating process, this means that the process is stopped when a layer of predeposited anode material still remains, such as 5% to 50%, covering the conducting electrode layer. Otherwise, uneven current distribution may occur in the respective electrochemical cells.

In some embodiments, the desired height of the plated structures are significantly less than the thickness of the predeposited anode material. This implies that several layers of structures can be plated onto one or several substrates before having to predeposit new anode material. In some examples the height of the predeposited material can be at least twice as thick as the height of the plated structures.

In some embodiments, multiple layers of ECPR plated structures are applied directly onto each other.

In a third step (c) after the ECPR etched or plated structures are formed, the master is separated from the substrate in a manner that minimizes damages on the master or on the ECPR etched or plated structures on the substrate. The method can be performed by holding the substrate in a fixed position and moving the master electrode in a direction perpendicular to the substrate surface or by holding the master electrode in a fixed position and moving the substrate in a direction perpendicular to the master electrode surface. In other embodiments, the separation can be performed in a less parallel manner in order to ease the separation. After the ECPR etching or plating step, remaining material deposited inside the cavities of the master electrode can be removed using removal methods that include applying wet etching chemicals suitable for dissolving the remaining materials. An anisotropic etching method can also be used for instance with dry-etching methods such as ion-sputtering, reactive-ion-etching (RIE), plasma-assisted-etching, laser-ablation, ion-milling. In some embodiments, said removal methods include a combination of dry-etching and wet-etching methods. The remaining material can in some embodiments also be removed by regular plating and/or ECPR plating onto any cathode and/or dummy substrate respectively. In some embodiments this is done prior to using the master electrode in another ECPR etching step or prior to predepositing new material inside the cavities of the master used for the ECPR plating step. Alternatively, during plating, only a portion of the predeposited material may be used in a single procedure and another portion of the predeposited material may be used in the next procedure, for a number of procedures. Alternatively, during etching, the material deposited on the cathode, i.e. the master electrode, may not need to be removed between each procedure, but may be removed between each second, third etc procedure.

Three embodiments of methods for forming a master electrode generally comprises the following steps:

1. supplying an insulating or conducting/semiconducting carrier 2. applying a conducting electrode layer onto at least some parts of said carrier 3. applying an insulating pattern layer onto at least some parts of said conducting electrode layer or 1. supplying an insulating or conducting/semiconducting carrier 2. applying an insulating pattern layer onto at least some parts of said carrier 3. applying a conducting electrode layer onto selected parts of said carrier which are not covered by said insulating pattern layer or 1. supplying and patterning a conducting/semiconducting carrier 2. applying an insulating pattern layer onto at least some parts of said patterned carrier 3. applying a conducting electrode layer into selected parts of said patterned carrier that is not covered by said insulating pattern layer.

The materials used for the portions of the master electrode that are exposed to the chemical and/or electrochemical environment during ECPR etching, ECPR plating, predeposition, cleaning and/or removal methods, are generally resistant to dissolution and oxidation in said chemical and/or electrochemical environment.

In one embodiment, said conducting electrode layer is applied onto said carrier and said insulating pattern layer is applied onto the conducting electrode layer.

In another embodiment, said insulating pattern layer is applied onto said carrier and said conducting electrode layer is applied onto at least some parts of the carrier inside the cavities of the insulating pattern layer.

In still another embodiment, recesses are created in said carrier and said insulating pattern layer is applied in areas of the carrier, which are not provided with the recesses, while said conducing electrode layer is applied onto the carrier in the bottom of and onto the walls of the recesses that are not covered by the insulating pattern layer.

Said carrier may comprise one or several layers of:

at least one conducting/semiconducting material; or at least one conducting/semiconducting material and at least one layer of insulating material.

Said layers of said carrier can be flexible and/or rigid and/or a combination of flexible and rigid layers. In some embodiments, said carrier is rigid enough to avoid bending down significantly into the cavities of said insulating pattern when applying the force needed to put the master electrode in contact with a substrate, thereby avoiding a short circuit contact between the carrier and the substrate during ECPR etching and/or ECPR plating. For instance, the distance that the carrier bends down when applying required pressure should be less than 50% of the height of the cavities, such as less than 25%, for example less than 10%, for instance less than about 1%. In one embodiment, said carrier is flexible enough to compensate for waviness and/or unevenness of the substrate when a distributed force is applied to put the master into contact with the substrate during ECPR etching and/or ECPR plating. In some cases, the carrier is at least as flexible as the substrate. For instance, the substrate can be a glass, quartz or silicon wafer. In this example, the master electrode carrier can have the same or higher flexibility as a glass, quartz or silicon wafer, respectively.

The conducing/semiconducting material can be of materials such as conducting polymers, conducting paste, metals, Fe, Cu, Au, Ag, Pt, Si, SiC, Sn, Pd, Pt, Co, Ti, Ni, Cr, Al, Indium-Tin-Oxide (ITO), SiGe, GaAs, InP, Ru, Ir, Re, Hf, Os, Rh, alloys, phosphorous-alloys, SnAg, PbAg, SnAgCu, NiP, AuCu, silicides, stainless steel, brass, conducting polymers, solder materials and/or combinations thereof. The insulating layer can be comprised of oxides such as SiO.sub.2, Al2O3, TiO2, quartz, glass, nitrides such as SiN, polymers, polyimide, polyurethane, epoxy polymers, acrylate polymers, PDMS, (natural) rubber, silicones, lacquers, elastomers, nitrile rubber, EPDM, neoprene, PFTE, parylene and/or other materials used for said insulating pattern layer mentioned below.

In one embodiment, the carrier comprises a conducing/semiconducting disc that is covered by an insulating material coating over at least some parts. The insulating material coating may be applied so that it covers all parts of said conducting/semiconducting disc except for the center parts on the front- and back-side. The insulating material coating can be applied by methods such as thermo-oxidation, Plasma-Enhanced-Chemical-Vapor Deposition (PECVD), Physical Vapor Deposition (PVD), Chemical-Vapor-Deposition (CVD), Flame Hydrolysis Deposition (FHD), electrical anodization, Atomic-Layer-Deposition (ALD), spin-coating, spray-coating, roller-coating, powder-coating, adhesive taping, pyrolysis, bonding by other suitable coating techniques and/or combinations thereof. The insulating material coating can be applied selectively to the intended parts of said conducting/semiconducting disc or by applying it to the entire conducting/semiconducting disc followed by removing parts of the insulating material coating in selected areas. For instance, the insulating material coating can be removed by etching methods, such as by using an etch-mask to protect the areas where the insulating material coating should be intact and/or by using mechanical removing methods.

Said etching methods can be wet-etching and/or dry-etching methods. Wet-etching is performed by applying liquid chemicals that dissolve the material intended to be etched, said chemicals often including strong oxidizing chemicals such as strong acids and the like. For instance, buffered, diluted or concentrated hydrofluoric acid can be used to etch SiO.sub.2 and other oxides. Said dry-etching methods can include methods such as ion-sputtering, reactive-ion-etching (RIE), plasma-assisted-etching, laser-ablation, ion-milling. The pattern of the etch-mask can be produced with lithographical methods such as photolithography, laser lithography, E-beam lithography, nanoimprinting and/or other lithographic processes suitable for patterning the etch-mask. Said etch-mask can be a polymer material, for instance a resist used in said lithographical methods such as a thinfilm photoresist, polyimide, BCB and/or a thick film resist. The etch-mask can also be a hard-mask comprising material such as SiN, SiC, SiO.sub.2, Pt, Ti, TiW, TiN, Al, Cr, Au, Ni, other hard materials and/or by combinations thereof. The hard-mask is patterned by said lithographical methods followed by etching the hard-mask selectively in the areas not covered by the patterned lithography mask. Said mechanical removing methods can include polishing, grinding, drilling, ablation, (sand or fluid) blasting and/or combinations thereof.

In another embodiment, the carrier comprises an insulating disc with at least some parts being of conducting/semiconducting material. In this case, the conducting/semiconducting part may be applied in the center of the insulating disc. In one embodiment, the carrier is formed by creating cavities in the insulating material disc in selected area and applying conducting/semiconducting material in the cavities. The cavities in the insulating disc can be formed by said wet-etching methods, said dry-etching methods and/or by said mechanical removing methods. Said etch-mask can be used in the method for creating the cavities and the etch-mask can be patterned with said lithographic methods. Methods for applying said conducting/semiconducting material in the cavities can be PVD, CVD, sputtering, electroless deposition, immersion deposition, electrodeposition, chemical grafting, electro-grafting, mechanical placement, soldering, gluing, by other suitable deposition methods and/or by combinations thereof. In some embodiments, a planarization step can be performed on the carrier in order to increase the planarity and to reduce surface roughness.

Said conducting electrode layer can be comprised of one or several layers of a conducting/semiconducting material. For instance, the conducting electrode layer can be comprised of Fe, Cu, Sn, Ag, Au, Pd, Co, Ti, Ta, Ni, Pt, Cr, Al, W, ITO, Si, Ru, Rh, Re, Os, Hf, Ir, Nb, other metals, alloys, phosforous-alloys, SnAg, SnAgCu, CoWP, CoWB, CoWBP, NiP, AuCu, silicides, graphite, diamond, stainless steel, conducting polymers, solder materials, conducting or semiconducting oxides or mixed oxides (for instance mixtures of oxides of above mentioned metals, such as ruthenium, iridium, rhodium, titanium and/or tantalum oxides) and/or combinations thereof. The conducting electrode layer can be applied to the carrier by methods such as ALD, Metallorganic-Chemical-Vapor-Deposition (MOCVD), PVD, CVD, sputtering, electroless deposition, immersion deposition, electrodeposition, electro-grafting, other suitable deposition methods and/or combinations thereof. In some embodiments, said conducting electrode layer can be deposited selectively onto conducting/semiconducting surfaces using methods such as electroless deposition, electrodeposition, immersion deposition, electrografting, chemical grafting, selective CVD and/or selective MOCVD.

In some embodiments, the conducting electrode layer is treated by thermal methods. Said thermal methods may be performed in high vacuum, forming gas, hydrogen gas, nitrogen gas, gas environments with low oxygen content and/or by combinations thereof. Said thermal methods can be annealing (e.g. rapid-thermo-annealing (RTA)), furnace treatment, flame anneal, hot-plate treatment and/or combinations thereof. Said thermal methods can in some embodiments improve the adhesion between the conducting electrode layer and the carrier and/or improve the electrical and/or mechanical properties of the master electrode (such as hardness and/or wear resistance), by reducing internal stress and/or contact resistance to said carrier. In some embodiments, the conducting electrode layer is formed by applying several layers of at least one material and by treating at least one layer by said thermal methods before applying a next layer.

In one embodiment, an adhesion layer is applied onto at least some parts of the carrier prior to applying said conducting electrode layer. Said adhesion layer can be comprised of a material or several materials that increase the adhesion of the conducting electrode layer to the carrier. The adhesion layer may be comprised of a conducting material such as Pt, Al, Ni, Pd, Cr, Ti, TiW or an insulating material such as AP-3000 (Dow Chemicals), AP-100 (Silicon Resources), AP-200 (Silicon Resources), AP-300 (Silicon Resources), silanes such as HMDS and/or combinations thereof. If necessary, the adhesion layer is not covering all areas of said carrier in order to enable an electrical connection to said carrier, such as when the adhesion layer is insulating. Alternatively the adhesion layer is applied covering the entire carrier and then some parts are removed in areas where electrical connection is required between the conducting electrode layer and the carrier, for instance in the center of the front-side. The adhesion layer can in some embodiments also function as a catalytic layer facilitating or improving the deposition of the conducting electrode layer. The adhesion layer can be applied by using deposition methods such as electrodeposition, spin-coating, spray-coating, dip-coating, Molecular-Vapor-Deposition (MVD), ALD, MOCVD, CVD, PVD, sputtering, electroless deposition, immersion deposition, electrografting, chemical grafting and/or other deposition methods suitable for the adhesion material.

Said insulating pattern layer can be comprised of one or several layers of patterned electrically insulating material. The insulating pattern layer may be applied with methods giving low surface roughness and high thickness uniformity of the layer. In some embodiments, the insulating pattern layer can be applied using methods such as thermal oxidation, thermal nitridation, PECVD, PVD, CVD, Flame Hydrolysis Deposition (FHD), MOCVD, electrochemical anodization, ALD, spin-coating, spray-coating, dip-coating, curtain-coating, roller-coating, powder-coating, pyrolysis, adhesive taping, bonding, by other deposition techniques and/or by combinations thereof.

In one embodiment, an adhesion layer is applied prior to applying the insulating pattern layer onto said carrier. Said adhesion layer may comprise at least one layer of at least one material that improves the adhesion properties between the insulating pattern layer and the surface of said carrier. Said adhesion layer may be comprised of an insulating or conducting material. Said adhesion layer can for instance be comprised of Pt, Ni, Al, Cr, Ti, TiW, AP-3000 (Dow Chemicals), AP-100 (Silicon Resources), AP-200 (Silicon Resources), AP-300 (Silicon Resources), silanes such as HMDS, Bottom-Anti-Reflective-Coating (BARC) materials and/or combinations thereof. The adhesion layer can be applied using methods such as PECVD, PVD, CVD, MOCVD, ALD, spin-coating, spray-coating, roller-coating, powder-coating and/or by combinations thereof.

In some embodiments, a planarization step can be performed on the applied insulating pattern layer in order to achieve a more planar surface. Said planarization step can be done prior to patterning the insulating pattern layer. Said planarization methods can include etching and/or polishing methods such as chemical-mechanical-polishing (CMP), lapping, contact planarization (CP) and/or dry etching methods such as ion-sputtering, reactive-ion-etching (RIE), plasma-assisted-etching, laser-ablation, ion-milling and/or by other planarization methods and/or by combinations thereof.

The insulating pattern layer can be comprised of organic compounds, such as polymers, as well as insulating in-organic compounds such as oxides and/or nitrides. Used polymer materials can for instance be: polyimide, siloxane modified polyimide, BCB, SU-8, polytetrafluoroethylene (PTFE), silicones, elastomeric polymers, E-beam resists (such as ZEP (Sumitomo)), photoresists, thinfilm resists, thickfilm resists, polycyclic olefins, polynorborene, polyethene, polycarbonate, PMMA, BARC materials, Lift-Off-Layer (LOL) materials, PDMS, polyurethane, epoxy polymers, fluoro elastomers, acrylate polymers, (natural) rubber, silicones, lacquers, nitrile rubber, EPDM, neoprene, PFTE, parylene, fluoromethylene cyanate ester, inorganic-organic hybrid polymers, (fluorinated and/or hydrogenated) amorphous carbon, by other polymers and/or by combinations thereof. Used in-organic compounds can for instance be organic doped silicon glass (OSG), fluorine doped silicon glass (FSG), PFTE/silicon compound, tetraethyl orthosilicate (TEOS), SiN, SiO.sub.2, SiON, SiOC, SiCN:H, SiOCH materials, SiCH materials, silicates, silica based materials, silsesquioxane (SSQ) based material, methyl-silsesquioxane (MSQ), hydrogen-silsesquioxane (HSQ), TiO.sub.2, Al.sub.2O.sub.3, TiN and/or combinations thereof. The insulating pattern layer materials may have properties that ease the patterning process (lithography and/or etching), have good adherence to the underlying layer, have good mechanical durability and/or are inert during the ECPR process and/or intermediate cleaning and/or removal steps.

In some embodiments, the pattern (cavities) of the insulating pattern layer is fabricated using methods such as lithography and/or etching. Said lithography methods can include photolithography, UV-lithography, laser-lithography, electron-beam (E-beam) lithography, nanoimprint, other lithographic methods and/or combinations thereof.

Said insulating pattern layer can have different heights depending on the desired size and height of the ECPR etched or plated structures. In some embodiments, said insulating pattern layer can have a thickness up to a few hundred microns. In other embodiments, the insulating pattern layer can be thin, such as down to 20 nm. In some embodiments, the height/width ratio of a cavity (called aspect ratio) is less than 10, such as less than about 5, for instance less than about 2, for example less than about 1. In some embodiments, such as for above-IC applications, the insulating pattern layer is less than about 50 .mu.m, for instance less than about 15 .mu.m, such as less than about 5 .mu.m, with an aspect ration of less than about 5, for instance less than about 2, such as less than about 1. In some embodiments, such as for IC interconnect applications, the insulating pattern layer is less than about 2 .mu.m such as for IC interconnect global wiring, such as less than 500 nm such as for IC interconnect intermediate wiring, for example less than 200 nm such as for IC interconnect intermediate wiring, such as less than about 100 nm such as for IC interconnect "Metal 1" wiring, for instance less than about 50 nm such as for IC interconnect "Metal 1" wiring. Since there is no forced convection inside said electrochemical cells, the limiting maximum current and hence the maximum plating/ etching rate is determined by the properties of the electrolyte and distance between the electrodes, i.e. the height of the insulating pattern layer. A higher limiting current is achieved using electrolytes comprising higher concentration of ions of the material being electrochemically etched or deposited. Furthermore, less distance between the conducting electrode layer and the seed layer of the substrate results in higher limiting current. However, short distance, i.e. thin insulating pattern layer, increases the risk of getting short circuits. The thickness of the structure layer to be formed can be less than about 90% of the insulating layer thickness, such as less than about 50%, for example less than about 10%.

Said etching methods include using an etch-mask to protect the areas where the insulating pattern layer should be intact and/or by using mechanical removing methods. Etching methods can include wet-etching and/or dry etching methods such as ion-sputtering, reactive-ion-etching (RIE), plasma-assisted-etching, laser-ablation, ion-milling. The pattern of the etch-mask can be produced with said lithographical methods. The etch-mask can be a polymer resist used in said lithographical methods such as a thinfilm photoresist, polyimide, BCB, a thick film resist and/or other polymers and the like. The etch-mask can also be a hard-mask comprising material such as SiN, SiO.sub.2, SiC, Pt, Ti, TiW, TiN, Al, Cr, Au, Cu, Ni, Ag, NiP, other hard materials, alloys thereof and/or combinations thereof. Said hard-mask can be applied with methods such as PVD, CVD, MOCVD, sputtering, electroless deposition, immersion deposition, electrodeposition, PECVD, ALD, other suitable deposition methods and/or combinations thereof. The hard-mask is in some embodiments patterned by said lithographical methods followed by etching the hard-mask, selectively in the areas not covered by the patterned lithography mask, using wet- and/or dry-etching methods.

In some embodiments, said hard-mask can comprise at least one layer of ECPR etched or plated structures, for instance when the materials used for the hard-mask are Cu, Ni, NiFe, NiP Au, Ag, Sn, Pb, SnAg, SnAgCu, SnPb and/or combinations thereof. In this case, the insulating pattern layer of a master electrode can be patterned by using another master electrode, in combination with said etching methods, and other lithographical methods may not be required.

In some embodiments, an etch-stop layer is applied prior to applying said insulating pattern layer. Said etch-stop layer comprises at least one layer of one or several materials that are less affected by the etching process than the insulating pattern layer, thereby stopping or slowing down the etching process thus protecting the underlying layer when the etching has gone through the insulating pattern layer. Said etch-stop layer can comprise materials such as: Ti, Pt, Au, Ag, Cr, TiW, SiN, Ni, Si, SiC, SiO.sub.2, Al, InGaP, CoP, CoWP, NiP, NiPCo, AuCo, BLOk™ (Applied Materials) or other materials less affected by said etching methods and/or combinations thereof.

In one embodiment, the said patterning methods can be modified in order to affect the angle of inclination of the pattern cavity sidewalls in the insulating pattern layer. The angle of inclination depends on the application of the ECPR etched or plated structures. In some embodiments, close to vertical sidewalls (close to 90 degree angle of inclination between the sidewalls of the insulating pattern layer and the carrier surface, vertical means in relation to a normal position of the structure in which it is horizontal) are used in order to achieve certain electrical properties. This means that the sidewalls have an angle to the normal of the electrode surface (angle of inclination) of less than about 1.degree., such as less than about 0.1.degree. In other embodiments, a larger angle of inclination is used in order to improve the separation method of the master electrode from the ECPR plated structures without causing damages either on the insulating pattern layer or on the ECPR plated structures. Such an angle may be up to about 45.degree., such as up to 20.degree., for example up to about 5.degree. Said separation method can be improved by modifying said angle of inclination so that it is more than zero degrees, which means that the cavities of the insulating pattern layer have an open area at the top which is larger than at the bottom (generally called "positive angle of inclination"). The angle should not be substantially negative.

In some embodiments, photoresists used for creating the insulating pattern layer, by using said lithographic methods may have chemical and physical properties that give vertical side walls or a positive angle of inclination. For instance, negative photoresists such as SU-8 (Microchem), THB (JSR Micro) or E-beam resists such as ZEP (Sumitomo) can be used in order to achieve an angle of inclination which is close to zero. Other positive photoresists such as AZ® AX™, AZ® P9200, AZ® P4000 (AZ Electronic Materials), ARF resists (JSR Micro), SPR resists (Rohm & Haas Electronic Materials) and/or other positive photoresists can be used for creating an insulating pattern layer with a positive angle of inclination. The angle of inclination can also be adjusted by modifying parameters of the photolithographic methods. For instance, the angle of inclination of the side walls can be varied by modifying the depth of focus when exposing the photoresist through a projection lens. Also, the angle of inclination can be optimized by varying parameters in a photolithographic patterning method, for instance: using wave-length filters, using anti-reflective coatings, modifying the exposure dose, modifying the development time, using thermal treatment and/or combinations thereof.

In another embodiment, said etching methods used for patterning said insulating pattern layer can be modified in order to achieve a vertical side wall or positive angle of inclination. For instance, a certain angle of inclination can be obtained by optimizing the gas composition, platen power (RF power) and/or plasma power (also called coil power) for dry-etching methods such Reactive-Ion-Etching (RIE). Said gas composition can for instance comprise fluorocarbon, oxygen, hydrogen, chlorine and/or argon. The angle of inclination can be controlled by modifying the level of polymerization of passivating substances on the side-walls. For instance, by increasing or decreasing the level of fluoro-carbon in the gas composition, the level of polymerization increases or decreases respectively which in turn results in an increased (less vertical) or decreased (more vertical) angle of inclination, respectively. Further, the degree of polymerization can be controlled by: modifying the oxygen and/or hydrogen content by increasing the oxygen level which reduces polymerization and give a smaller angle of inclination (more vertical) and vice versa; and/or by increasing the hydrogen level which increases polymerization and give a larger angle of inclination (less vertical) and vice versa. In some embodiments, said angle of inclination is decreased (made more vertical) by decreasing said coil power while holding said platen power constant. This increases the sputtering effect and thereby results in more vertical side walls when etching said insulating pattern layer. By instead increasing said coil power the opposite effect can be achieved thereby resulting in a larger angle of inclination (less vertical). In another embodiment, said angle of inclination is decreased (more vertical) by increasing said platen power while said coil power is held constant. A larger angle of inclination (less vertical) when etching said insulating pattern layer can be achieved by decreasing said platen power while said coil power is held constant.

In yet another embodiment, a damascene process can be used to the create the cavities (pattern) of said insulating pattern layer; said damascene process involving firstly applying a sacrificial pattern layer onto a carrier; secondly applying an insulating material so that it cover said sacrificial pattern layer as well as fills up the cavities of the sacrificial pattern, by using said application methods mentioned above for the insulating pattern layer; planarizing said insulating material, using planarization methods mentioned above, until the sacrificial pattern layer is uncovered; and removing said sacrificial pattern layer whereby an insulating pattern layer is formed. Said sacrificial pattern layer can for instance be formed by ECPR etching or plating a structure layer or by using known lithographical and/or etching/plating methods. This alternative patterning method can for instance be used for embodiments including an insulating pattern layer material which is difficult to pattern directly with lithography and/or etching methods.

In an embodiment, said insulating pattern layer surface can be treated in order to improve better separation from the ECPR plated structures. For instance, the insulating pattern layer surface can be treated with methods that give an anti-sticking effect between the side-walls of said cavities and the side-walls of ECPR plated structures. This can include coating said insulating pattern layer surface with a release layer that decreases the mechanical and chemical bonds to ECPR plated structures. Such a release layer can be applied using spin-coating, spray-coating, CVD, MOCVD, MVD, PVD and/or by combinations thereof. Said release layer can comprise: silanes such as methoxy-silanes, chloro-silanes, fluoro-silanes, siloxanes such as poly-di-methyl-siloxane, poly-ethylane-glycol-siloxanes, dimethyl-siloxane oligomer (DMS) and/or other polymers such as amorphous fluoro-polymers, fluoro-carbons poly-tetra-fluoro-ethylen (PTFE), Cyto-fluoro-polymers and/or combinations thereof.

In one embodiment, the materials used for the insulating pattern layer have properties and/or are treated with methods that improve the ability of getting said electrolyte to wet and to fill up the cavities of the insulating pattern. In one embodiment, at least some parts of the insulating pattern layer materials have low surface energy properties and are hydrophilic, i.e. have a low contact angle with aqueous solutions. Furthermore, some parts of the insulating pattern layer material can be treated with methods that lower the surface energy and create hydrophilic surfaces. Such surface treatment methods can for instance be thermal treatment, oxygen/nitrogen/argon plasma treatment, surface conversion for anti-sticking (SURCAS) and/or treating the surface with strong oxidizing agents such as peroxides, persulfates, concentrated acids/bases and/or combinations thereof. In other embodiments, at least some parts of the insulating pattern layer have high surface energy or can be treated with methods in order to increase the surface energy making the surface hydrophobic. Such methods can include treatment with hydrogen plasma. In an embodiment, the insulating pattern layer comprises one or several layers of at least one material having properties such that the side-walls of the cavities of the insulating pattern layer become hydrophilic and the top of the insulating pattern layer becomes hydrophobic. Said hydrophilic material can be for instance be SiN, SiO.sub.2, polymers (such as photoresists and/or elastomers) that have been treated with oxygen plasma and/or other materials with polar functional molecule groups at the surface and/or combinations thereof. Said hydrophobic material can be materials with non-polar functional molecule groups such as hydrogen terminated polymers, Teflon, fluoro- and chloro-silanes, siloxanes, fluoro-elastomers and/or combinations thereof.

In another embodiment, the insulating pattern layer can have one or several layers of at least one material which improve the mechanical contact between the top of the insulating pattern layer surface and the seed layer surface of the substrate when the master electrode is pressed against said seed layer. As mentioned above, the insulating pattern layer can be comprised of at least one layer of flexible materials such as elastomers. In one embodiment, the insulating pattern layer comprises at least one layer of rigid material and at least one layer of said elastomer material. Said layers of elastomer material may be applied on top of said layers of rigid material. Said elastomer layer can: have high compressibility and/or elastic properties; be electrically insulating and/or have low dielectric properties; have good chemical resistance against the environment used in the ECPR process and/or intermediate cleaning and/or removal steps, for instance against said electrolytes; be applied by methods such as PECVD, PVD, CVD, MOCVD, ALD, spin-coating, spray-coating, roller-coating, powder-coating, pyrolysis and/or combinations thereof; have strong adhesion to underlying layers such as metals, silicon, glass, oxides, nitrides and/or polymers; have high resistance against shrinking or swelling over time and/or in the environment used in the ECPR process, for instance in said electrolytes; be non-bleeding, i.e. are not releasing contaminating organic compounds; be sensitive to UV-light; be patterned with said lithography methods; be transparent; and/or be patterned by using said etching methods, for instance by said dry-etching methods. In some embodiments, said elastomers can be comprised of Poly-Di-Methyl-Siloxane (PDMS), silicones, epoxy-silicones, fluoro-silicones, fluoro-elastomers, (natural) rubber, neoprene, EPDM, nitrile, acrylate elastomers, polyurethane and/or combinations thereof. In some embodiments, said elastomer layer can have a tensile elastic modulus (Young's modulus) less than 0.1 GPa, such as less than 1 MPa, for example less than about 0.05 MPa. In some embodiments, said elastomer layer can have a hardness of less than 90 Shore-A, such as less than 30 Shore-A, for example less than about 5 Shore-A.

In other embodiments, an insulating layer is applied onto at least some parts of an already patterned surface, for instance a patterned carrier. In an embodiment, the insulating pattern layer is applied with a method in which the applied materials conformally follow the structures of underlying patterned carrier for instance by using methods such as thermal oxidation, thermal nitridation, sputtering, PECVD and/or ALD. Said insulating layer can be patterned in order to uncover at least some parts of said underlying patterned carrier. Said patterning method may uncover at least some parts of the cavities of said underlying patterned carrier from the insulating pattern layer. A usable patterning method includes that the insulating pattern layer is covering the side-walls and/or the top of the structures of said patterned carrier while the bottoms of the cavities of said patterned carrier are uncovered in at least some areas. Said patterning methods can be methods such as said lithography and/or etching methods described above. In some embodiments, said patterned carrier has at least one layer of insulating material on top of the patterned structures prior to applying said insulating pattern layer. For instance, the carrier is patterned by using said etching methods where the etch-mask comprise at least one layer of insulating material and the etch-mask is not stripped prior to applying said insulating pattern layer. This results in a thicker layer of insulating material on top of the structures, compared to the bottom, of said patterned carrier. In this embodiment, using etching methods, such as said dry-etching methods, can uncover the bottom of the cavities of the patterned carrier before uncovering the top. Said dry-etching method may have a higher etching speed in the direction perpendicular do the plane of said patterned carrier than in lateral direction, known as anisotropic etching, which allows for uncovering the insulating pattern material in the bottom of the cavities of the patterned carrier while leaving the side-walls still covered by the insulating material. In other embodiments, the insulating pattern layer is patterned in order to uncover at least some parts that can be used for electrical connection to said carrier and/or said conducting electrode layer.

Several embodiments of the master electrode will be described below with reference to the Figures on the drawings.

An embodiment includes supplying a carrier 1 comprising a conducing/semiconducting disc 2 and an insulating coating layer 3. Said insulating coating layer 3 may cover all areas of the conducting/semiconducting disc 2 except for an area in the center on the back-side and front-side, as shown in FIG. 1(*a*). A conducting electrode layer 4 can be applied onto the front-side of the carrier 1, covering and being in electrical contact with at least some parts of the conducting/semiconducting disc 2. In one embodiment, said conducting electrode layer 4 is also covering at least some parts of said insulating coating layer 3. In some embodiments, a connection layer 5 is applied onto at least some parts of said conducting/semiconducting disc on the back-side of the carrier in order to enable a good electrical connection to the master electrode from an external electrical source. A cross section of one embodiment of a carrier 1, comprising a conducting/semiconducting disc 2 and an insulating coating layer 3, with a conducting electrode layer 4 and connection layer 5 is illustrated in FIG. 1(*b*). In an embodiment, an insulating material 6 is applied onto the carrier 1 and the conducting electrode layer 4 as shown in FIG. 1(*c*). The insulating material can be patterned using said lithographical and/or etching methods, forming an insulating pattern layer 7. A cross section of an embodiment of a master electrode 8 comprising a carrier 1, conducting electrode layer 4, connection layer 5, and insulating pattern layer 7 is illustrated in FIG. 1(*d*).

In an embodiment, a carrier 1 comprises an insulating disc 9 with a conducting via 11 in the center at least partly filled with conducting/semiconducting material 10, as illustrated in FIG. 2(*a*). The insulating disc 9 may be transparent in order to enable alignment capabilities between the master electrode and a substrate. In one embodiment, a conducting electrode layer 4 is applied onto the front-side of the carrier 1. In addition, a connection layer 5 can be applied on the back-side in order to enable a good electrical connection from an external electrical source to the master electrode. Electric connection between the conducting electrode layer 4 and the connection layer 5 is enabled by the via 11. A cross section of one embodiment of a carrier 1, which comprises an insulating disc 9 and a conducting via 11, a conducting electrode layer 4 and a connection layer 5 is illustrated in FIG. 2(*b*). An insulating material 6 can be applied onto the carrier 1 and the conducting electrode layer 4 as shown in FIG. 2(*c*). The insulating material can be patterned using said lithographical and/or etching methods, forming an insulating pattern layer 7. FIG. 2(*d*) illustrates a cross section of one embodiment of a master electrode comprising a carrier 1, which comprise an insulating disc 9 and a conducting via 11, a conducting electrode layer 4, a connection layer 5 and an insulating pattern layer 7.

Figures 3A, 3B, 3C, 3D, 3E:
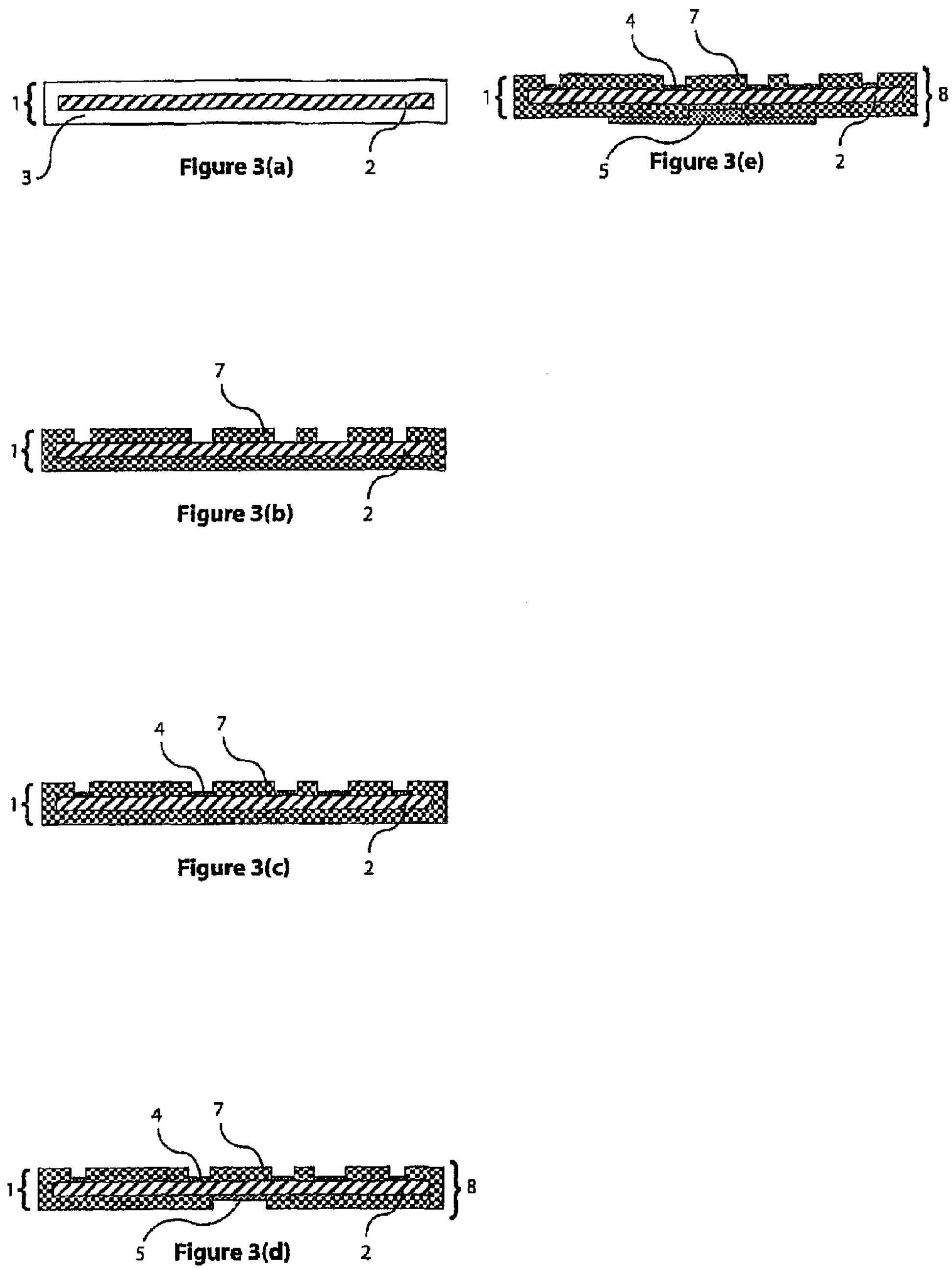
FIGS. 3(*a*) to 3(*e*) are schematic cross-sectional views of several method steps in forming a master electrode from a conducting carrier with added conducting layer in a pattern.
Figure 4A:
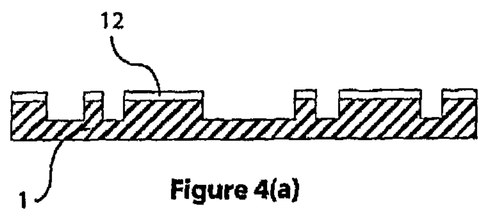
FIGS. 4(*a*) to 4(*e*) are schematic cross-sectional views of several method steps in forming a master electrode with pattern arranged in the carrier.
Figure 4E:
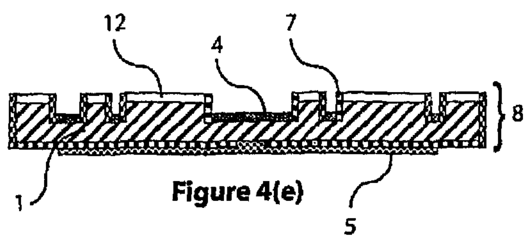
Figure 4B:
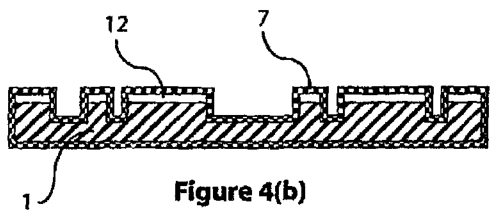

Another embodiment includes supplying a carrier 1 comprising a conducting/semiconducting disc 2 which is covered by an insulating coating layer 3 on at least some parts, such as on the front-side, of said carrier. In some embodiments, the insulating coating layer is firstly applied so that it completely covers said conducting/semiconducting disc, as illustrated in FIG. 3(*a*). In an embodiment, the insulating coating layer is patterned using said lithographical and/or etching methods creating an insulating pattern layer 7. In the cavities thus formed, at least some parts of the conducting/semiconducting disc 2 are uncovered, as illustrated in FIG. 3(*b*). The conducting electrode layer 4 can be applied selectively onto the conducting/semiconducting disc in the bottom of the cavities in the insulating pattern layer as shown in FIG. 3(*c*). Some parts, such as the center of the back-side, of the insulating pattern layer 7 can be removed, thereby uncovering the conducting/semiconducting disc 2, in order to enable an electrical connection to the master electrode. A connection layer 5 can be applied on the uncovered area of the conducting/semiconducting disc, such as on the back-side, of the master electrode in order to enable a good electrical connection from an external electrical source to the master electrode. In some embodiments, some parts of the insulating pattern layer 7 at the backside are removed prior to applying the conducting electrode layer 4. The connection layer 5 can then be applied in the same step and with the same method as applying the conducting electrode layer. However, in some embodiments the connection layer 5 can be comprised of at least one layer, applied in the same step as applying the conducting electrode layer 4, and at least another conducting layer applied in a subsequent step. FIG. 3(*d*) illustrates a cross section of a master electrode 8 comprising a conducting/semiconducting disc 2, an insulating pattern layer 7, a conducting electrode layer 4 and a connection layer 5. FIG. 3(*e*) illustrates a cross section of another embodiment of a master electrode 8 comprising a conducting/semiconducting disc 2, an insulating pattern layer 7, a conducting electrode layer 4 and a connection layer 5 where the connection layer comprises several layers where at least one is also covering some parts of the insulating pattern layer 7 at the backside.

A further embodiment includes supplying a conducting/semiconducting carrier 1. The carrier is patterned on at least the front-side using said lithographical and/or etching methods. In one embodiment, an etch-mask 12 which is used for patterning the carrier comprises an insulating material.

A cross section of the patterned conducting/semiconducting carrier 1, with an insulating material as etch-mask 12, is illustrated in FIG. 4(*a*). An insulating pattern layer 7 can be applied onto said patterned carrier and onto said etch-mask 12. In some embodiments, the insulating pattern layer 7 is applied with a method so that it conformally follows the structures of the underlying pattern layer, as shown in FIG. 4(*b*). This results in a thicker insulating layer on top of said pattern than in the bottom of the cavities because of the combination with layer 12.

Said etching methods can be used to uncover the carrier 1 from the insulating pattern layer 7 in the bottom of the pattern while leaving the insulating pattern layer 7 on the side walls and on the top. Dry-etching methods can be used that are characterized by having a higher etch-rate in the bottom of the cavities than on the side walls. In some embodiments, the same amount of insulating material is removed from the bottom of the cavities as on the top, leaving an insulating material thickness on the top corresponding to the thickness of said etch-mask 12 used for patterning the carrier. FIG. 4(*c*) illustrates a master electrode 8 comprising a patterned carrier 1, an etch-mask 12 and an insulating pattern layer 7 that has been etched in order to uncover the bottom of the cavities of the patterned carrier.

In some embodiments, a conducting electrode layer is applied selectively in the areas on the patterned carrier 1 that is not covered by an etch-mask 12 or an insulating pattern layer 7; and a second etch-mask 12 can be applied in the back-side in order to remove the insulating pattern layer and thereby uncovering some parts of the carrier 1 in a subsequent step, as shown in FIG. 4(*d*).

Removing parts of the insulating pattern layer 7 at the backside can be done by using said lithographical, and/or etching methods. A connection layer 5 can be applied on the uncovered parts of the carrier in order to enable a good electrical connection from an external electrical source to the master electrode. In some embodiments, the electrical connection in the master electrode is fabricated in the center of the back-side of the master electrode. In some embodiments, the connection layer 5 is applied in the same step as applying the conducting electrode layer 4. In this case, the uncovering of the carrier 1 in the connection area, is done prior to applying the conducting electrode layer 4. In some embodiments, the connection layer 5 is applied only in the uncovered parts of the carrier 1. In other embodiments, the connection layer is applied on the uncovered parts of the carrier and onto some parts of the insulating pattern layer 7.

FIG. 4(*e*) illustrates a cross section of one embodiment of a master electrode comprising a patterned conducting/semiconducting carrier 1 with an insulating etch-mask 12 on top of the carrier structures, an insulating pattern layer 7, a conducting electrode layer 4 applied in the cavities of the patterned carrier and a connection layer 5 applied on the back-side onto some parts of the insulating pattern layer and onto the uncovered parts of the carrier.

Figure 5:
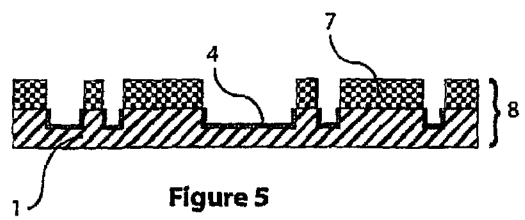
FIG. 5 is a schematic cross-sectional view of a master electrode in which cells of the pattern are deep.
Figure 4C:
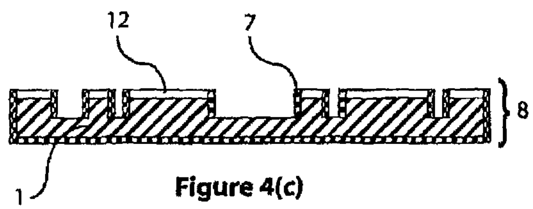
Figure 4D:
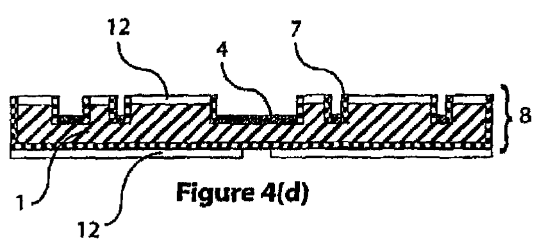

In some embodiments, the cavities of the master electrode (8) can be made deeper, prior to applying the conducting electrode layer 4, by removing material from the carrier 1 in the bottom of the cavities of the insulating pattern layer 7, for instance by using said etching methods. In some embodiments, dry-etching methods can be used. For some embodiments, said insulating pattern layer 7 can be used as an etch-mask. Creating deeper cavities results in that the master electrode cavities can be filled with a larger amount of predeposited material used for ECPR plating and/or by etched material during ECPR etching. FIG. 5 illustrates a cross section of a master electrode 8 where the cavities of the insulating pattern layer 7 have been etched deeper into the carrier 1 which thereafter has been covered by a selectively deposited conducting electrode layer 4.

One embodiment includes forming said insulating pattern layer 7 onto said carrier 1 by bonding and patterning an insulating bond-layer 13. In some embodiments, the carrier 1 comprises a conducting/semiconducting disc 2 covered with an insulating coating layer 3 except for in the center of the front- and back-side of the carrier. In other embodiments, the carrier comprises an insulating disc 9 with a conducting via 11 in the center of the carrier 1.

In some embodiments a conducting electrode layer 4 has been applied onto the carrier prior to applying the insulating bond-layer 13. In some embodiments, the insulating bond-layer is adhered to a bond-carrier 14 that can be removed after the insulating bond-layer 13 has been applied onto the carrier 1. For instance, the insulating bond-layer 13 can be SiO.sub.2 on a Si bond-carrier 14 or the insulating bond-layer 13 can be glass, such as quartz, or a polymer film on any removable bond-carrier 14. In some embodiments, an adhesive bond-layer 15 can be applied onto the insulating bond-layer 13 prior to bonding it to the carrier 1 in order to improve bonding properties such as adhesive strength. The adhesive bond-layer 15 can be of a material that gives good bond-properties together with the carrier and/or with the conducting electrode layer 4 on the carrier 1 and should be of a conducting material. Alternatively, the adhesive bond-layer 15 can be of a non-conducting material and be selectively removed by etching. For instance, the adhesive bond-layer 15 may comprise a metal and/or an alloy that bonds well with the conducting electrode layer 4. The adhesive bond-layer can comprise materials such as mentioned for said conducting electrode layer 4.

Figure 6A:
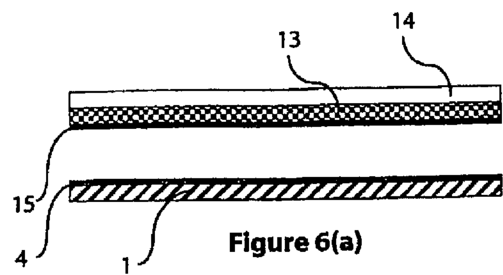
FIGS. 6(*a*) to 6(*c*) are schematic cross-sectional views of several method steps in forming a master electrode with an adhesion layer bonded insulating pattern layer.
Figure 7B:
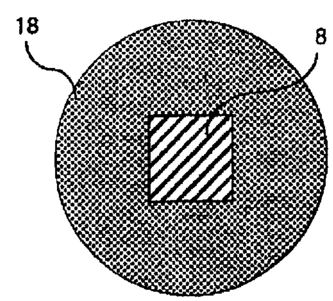
FIG. 7(*a*) is a schematic cross-sectional view and FIG. 7(*b*) is a top view of a master electrode applied on a large substrate.
Figure 6B:
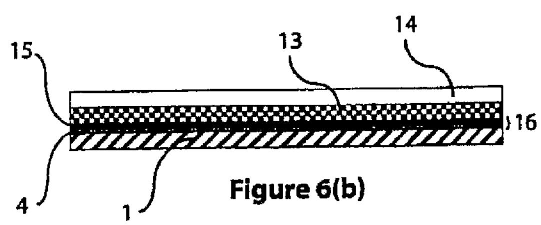
Figure 7C:
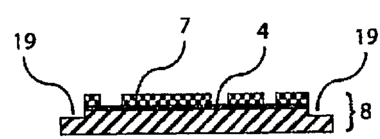
Figure 6C:
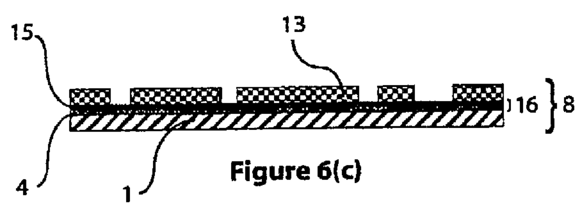
Figure 7D:
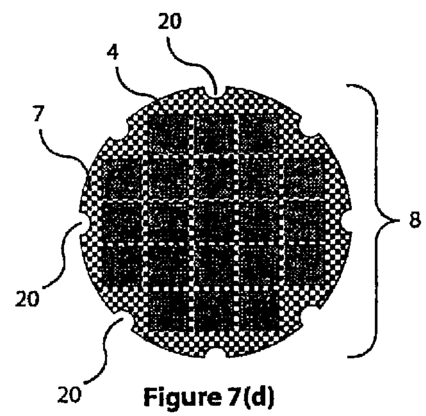
Figure 7A:
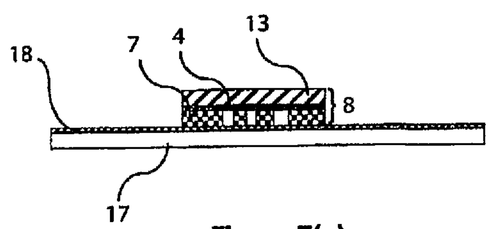
Figure 7E:
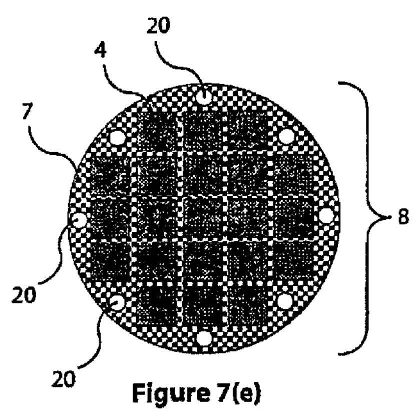
Figure 7F:
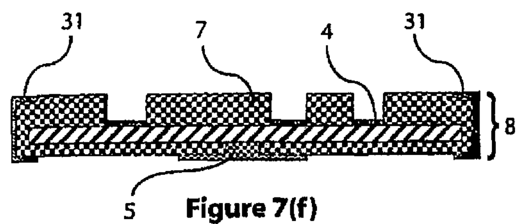
Figure 7G:
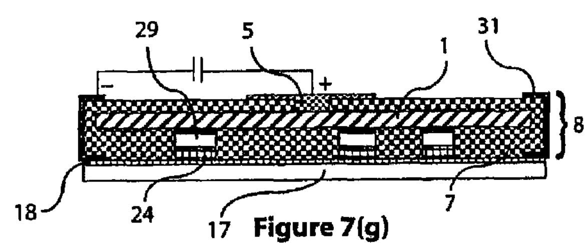
Figure 7H:
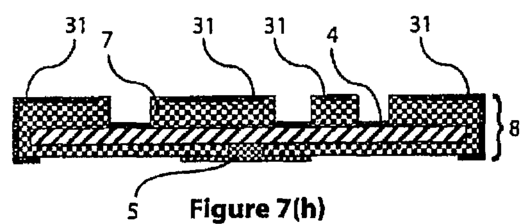
Figure 7I:
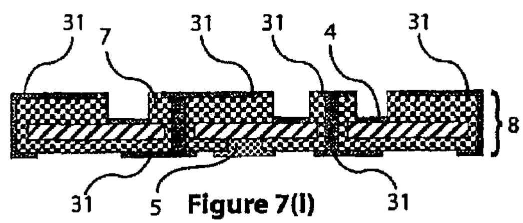

A cross section of a carrier 1 with a conducting electrode layer 4 and a bond-carrier 14 with an insulating bond-layer 13 and an adhesive bond-layer 15 prior to bonding is illustrated in FIG. 6(*a*).

FIG. 6(*b*) illustrates how an insulating bond-layer 13 on a bond-carrier 14 is bonded to a carrier 1 with a conducting electrode layer 4 and an adhesive bond-layer 15 in-between. In some embodiments, the layers in-between the insulating bond-layer 13 and the carrier 1 are altered (e.g. mixed) during the bonding process and a bond-intermediate layer 16 is formed. The bond-carrier 14 can be removed mechanically and/or by using said etching methods, such as dry-etching or wet-etching. After the bond-carrier 14 has been removed, the insulating bond-layer 13 can be patterned using said lithographical and/or etching methods. FIG. 6(*c*) illustrates a cross section of one embodiment of a master electrode 8 comprising a patterned insulating bond-layer 13 that has been bonded to a carrier 1 with a bond-intermediate layer 16 in between which is comprising a conducting electrode layer 4 and an adhesive bond-layer 15. In some embodiments, a conducting electrode layer 4 can be applied selectively into the cavities of the patterned insulating bond-layer 13 onto said bond-intermediate layer 16 or onto said carrier 1 if no bond-intermediate layer 16 exists (i.e. when the insulating bond-layer 13 is applied directly onto the carrier 1).

In an embodiment, the master electrode enables an electrical connection from an external electrical source to at least some parts of said conducting electrode layer.

In some embodiments, the electrical connection in made from an external electrical source to said conducting/semiconducting material of said carrier which is connected to at least some parts of the conducting electrode layer.

In an embodiment, the electrical connection is made from an external electrical source to a connection layer which is connected to at least some parts of the conducting/semiconducting parts of the carrier which in turn is connected to the conducting electrode layer.

The electrical connection can for instance be located on the back-side of said carrier, i.e. the opposite side of the insulating structures of the master electrode. In some embodiments, the electrical connection can be used in the center of the back-side of said carrier. In another embodiment, the electrical connection is made from front-side, such as in the perimeter of said carrier.

In some embodiments, the insulating parts of said carrier and/or the insulating pattern layer have been applied in a way that there will be no significant electrical connection and/or no short circuit between the electrical connection to the conducting electrode layer and the electrical connection to the substrate, either directly and/or through the electrolyte, except for in the electrolyte filled cavities defined by the insulating pattern layer and the substrate during ECPR etching or ECPR plating. For instance, insulating material is covering all conducting/semiconducting parts of the carrier except for in the cavities of the insulating pattern layer and in an electrical connection area.

In some embodiments, the master electrode is characterized by allowing for creating an electrical connection from an external electrical source to a substrate seed layer when the master electrode is put in contact with the substrate during ECPR etching or plating.

In some embodiments, at least some areas of said seed layer, which can be used for electrical contact, is not covered by the master electrode during physical contact with the substrate.

In some embodiments, an electrical contact to the substrate seed layer can be supplied by having a master electrode with an area that enters into physical contact with a larger substrate seed layer area.

FIG. 7(*a*) illustrates a cross section of a master electrode 8 with smaller area that enters into contact with a large substrate 17 seed layer 18 area.

FIG. 7(*b*) illustrates a top view of one embodiment of a master electrode with smaller area that enters into contact with a larger substrate seed layer 18 area.

In some embodiments, the master electrode and the substrate have the same dimensions and material has been removed from the master electrode in at least some areas in order to give place for an electrical connection to the seed layer on the substrate. In one embodiment, a recess is arranged in the perimeter of the master electrode which allows for a connection to the seed layer of the substrate.

FIG. 7(*c*) illustrates a cross section of a master electrode 8 with a recess 19 that allows for electrical connection to the substrate seed layer. Said recess can be present all around the circumference of the master electrode or in a few specific connection sites.

In some embodiments, connection holes 20 can be made through the master electrode 8 allowing for electrical connection to the seed layer 17 of the substrate 17. In one embodiment, the connection holes 20 are made adjacent the perimeter of the master electrode 8.

FIG. 7(*d*) illustrates a top view of the front-side of a master electrode 8, comprising an insulating pattern layer 7 and a conducting electrode layer 4, with connection holes 20 in the perimeter. In one embodiment, the connection holes 20 are made inside the master electrode 8 area, as illustrated in a top view in FIG. 7(*e*). Said recess and/or connection sites can be created by methods such as said lithographical and/or etching methods and/or with mechanical methods such as polishing, grinding, drilling, ablation, CNC-machining, ultra-sonic machining, diamond machining, waterjet machining, laser machining, (sand or fluid) blasting, and/or by combinations thereof. The recess and/or connection sites may be dimensioned to fit electrical contacts. An electrical contact can for instance be a thin foil, springs, pins and/or other suitable electrical contacts and/or by a combination thereof. The electrical contact can comprise at least one layer of material that does not erode or oxidize during the ECPR etching and/or plating process and/or in the electrolytes used therefore, for instance: stainless steel, Au, Ag, Cu, Pd, Pt, platinized titanium and/or by combinations thereof.

In some embodiments, the connection sites to the seed layer, provided by the master electrode design, are located in a way that it enables a uniform current distribution in the seed layer during ECPR etching and/or plating. For instance, a recess can be located all along the perimeter of the master electrode which allows for a continuous electrical connection to the seed layer perimeter. In another embodiment, a number of (such as at least three) connection holes can be distributed evenly along the perimeter of the master electrode, which enables that a well distributed electrical connection can be achieved to the seed layer of the substrate.

In some embodiments, the parts of the master electrode that are conducting and connected to the conducting electrode layer and are located in contact with and/or in close proximity of the electrical connection to the seed layer, are coated with and insulating material in order to prevent a short circuit from the conducting electrode layer of the master electrode to the substrate seed layer during ECPR etching and/or ECPR plating.

In some embodiments, an electrical seed layer connection is an integrated part of the master electrode. In this case, the seed layer connection on the master electrode must be isolated from the conducting parts of the master electrode that are connected to the conducting electrode layer. Otherwise there could be a short circuit between the two electrodes when the master electrode is used for ECPR etching or plating. In some embodiments, the electrical connection to the conducting electrode layer of the master electrode is made in the center of the back-side of said carrier where the insulating coating of the carrier has been removed. In this case, the seed layer connection can be a conducting layer from the back-side perimeter to the front-side, separated from the conducting parts of the carrier by an insulating material. Said seed layer connection can comprise the same materials and can be applied with the same methods as used for said conducting electrode layer described above.

FIG. 7(*f*) illustrates a master electrode 8 comprising a conducting carrier, an insulating pattern layer 7 and a conducting electrode layer 4. Said insulating pattern layer is covering all areas of the conducting carrier except for in the cavities on the front side and in the center of the back-side, in which an electrical connection is enabled through a connection layer 5. Said seed layer connection 31 is provided on the perimeter on the back-side, the edge, and the perimeter on the front side of the master electrode. The seed layer connection 31 is isolated from the other conducting parts of the master electrode by the insulating pattern layer. An insulating layer may be arranged at the lateral sides of the seed layer connection.

FIG. 7(*g*) illustrates how the master electrode 8 comprising an insulating pattern layer 7, a conducting carrier 1, a conducting electrode layer 4, a connection layer 5 and a seed layer connection 31 is put in contact with a substrate 17 with a seed layer 18. An electrolyte 29 is enclosed in the electrochemical cells defined by the cavities between the insulating patter layer and the seed layer. An external electrical voltage source is connected to the connection layer 5 (said connection layer being electrically connected to said conducting electrode layer 4 through said carrier 1) and to the seed layer connection 31 (said seed layer connection being electrically connected to said seed layer) whereby an anode material, which is predeposited on said conducting electrode layer, which is anode, in the cavities of the insulating pattern layer, is dissolved and transported through said electrolyte and plated structures 24 are formed onto the seed layer, which is cathode, inside said electrochemical cells. By reversing the polarity of the electric voltage source, electrochemical etching of the seed layer takes place.

FIG. 7(*h*) illustrates how the seed layer connection 31 is arranged over a large surface of the pattern layer 7 and substantially over the entire surface, except adjacent the edges to the cavities of the pattern layer. The separate seed layer connection portions 31 shown in FIG. 7(*h*) are interconnected at other positions not shown in FIG. 7(*h*) because the surface of the pattern layer may form a continuous surface.

If the surface of the pattern layer does not form a continuous surface, the different portions 31 of the connection can be connected with connection areas at the backside of the carrier through the carrier as shown in FIG. 7(*i*). Otherwise, the seed layer contacted by the separate connection portions 31 may form a connection between the separate connection portions 31. The separate connection portions 31 can contribute to decreasing the resistance of the seed layer, especially at thin seed layers. Less resistance may have advantages as described further below.

In some embodiments, said recess (see FIG. 7(*d*)) is created in the perimeter of a carrier used for the master electrode in order to improve some methods for applying an insulating pattern layer to said carrier. For instance, when an insulating pattern layer is fabricated by spin-coating or spray-coating the carrier with a polymer (e.g. a photoresist) an edge-bead of insulating material may be formed in the perimeter of the carrier because of the application process. By creating a recess in the carrier prior to applying an insulating pattern layer using spin-coating or spray-coating the edge-bead effect can be reduced or even eliminated. By reducing or eliminating the edge-bead, a more planar surface can be achieved on the master electrode which improves the physical contact between the master electrode and the substrate during ECPR etching and/or ECPR plating. The edge-bead effect is much depending on the character of the recess used for the carrier. Different embodiments of recessed carriers for the master electrode are illustrated in FIGS. 8(*a*) to 8(*h*).

Figure 9A:
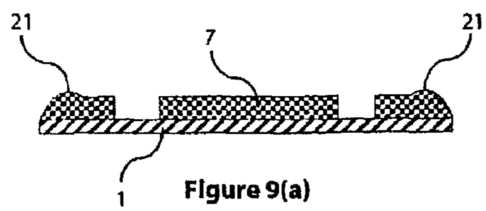
FIGS. 9(*a*) to 9(*b*) are schematic cross-sectional views in which edge beads are included and mitigated, respectively.
Figure 9B:
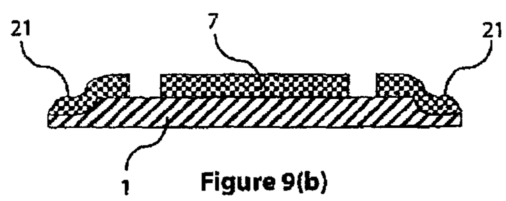

FIG. 9(*a*) illustrates how and edge-bead 21 has been formed in the insulating pattern layer 7 when using a carrier 1 without any recess. FIG. 9(*b*) illustrates how the edge-bead 21 in the insulating pattern layer 7 is reduced when using a carrier with a recess using one of the embodiments illustrated in FIG. 8. Any and all of the embodiments, in FIGS. 8(*a*) to 8(*h*) can be used in order to reduce the edge-bead 21 of an insulating pattern layer 7.

Figure 10C:
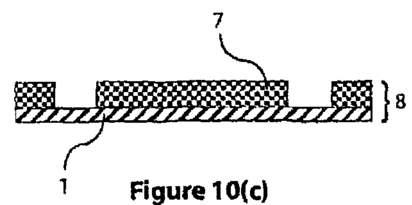
FIGS. 10(*a*) to 10(*c*) are schematic cross-sectional views and show a method for forming a master electrode without edge beads.
Figure 10A:
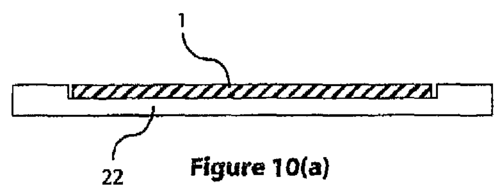
Figure 10B:
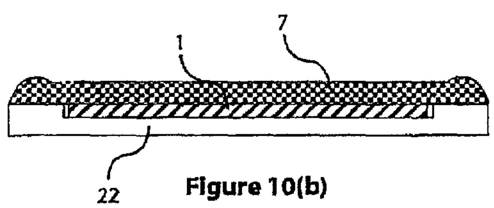
Figure 12A:
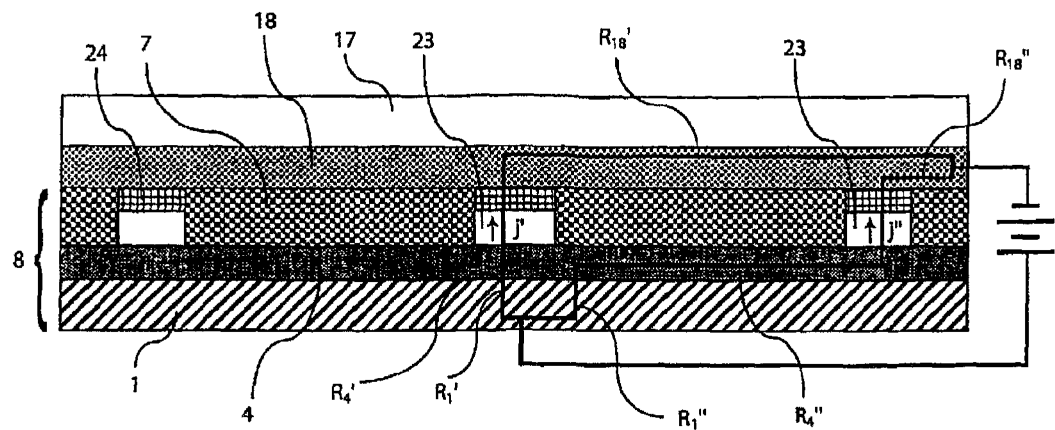
FIG. 12(*a*) is an enlarged cross-sectional view of conductive paths in several electrochemical cells.
Figure 12B:
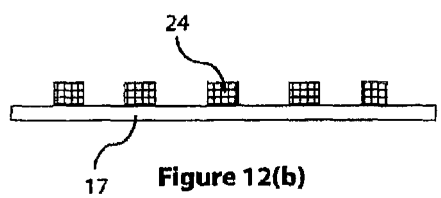
Figure 12C:
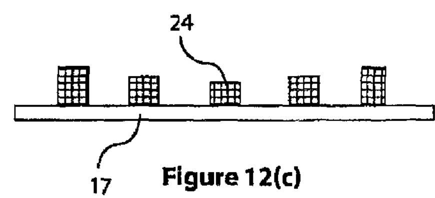
Figure 12D:
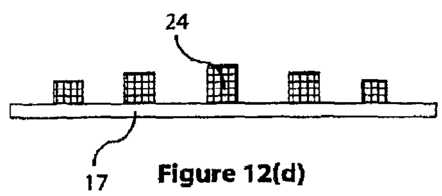

In some embodiments, the edge-bead 21 can be reduced by using a spin-carrier 22 when applying the insulating pattern layer 7 by spin-coating. The method for using a spin-carrier 22 is characterized by the spin-carrier 22 having a recess in which the master electrode carrier 1 is embedded, as shown in FIG. 10(*a*). The height of the recess in the spin-carrier may be the same as the thickness of the carrier of the master electrode. The gap between the edge of the carrier of the master electrode and the side wall spin-carrier's cavity is made as small as possible. The carrier 1 can be attached to the spin-carrier for instance with an adhesion layer and/or by applying vacuum through one or several vacuum-grooves that have been fabricated in the spin-carrier.

When applying the insulating pattern layer 7 by spin-coating using said spin-carrier 22, the edge-bead 21 of the insulating pattern layer 6 will appear in the perimeter of the spin-carrier 22 instead of in the perimeter of the master electrode carrier 1, which is illustrated in FIG. 10(*b*). FIG. 10(*c*) illustrates the master electrode 8 after separating it from the spin-carrier 22 and after patterning the insulating pattern layer 7.

Figure 11A:
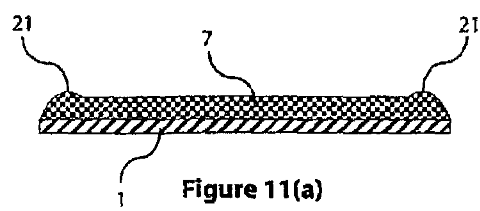
FIGS. 11(*a*) to 11(*b*) are schematic cross-sectional views and shows a method for forming a master electrode without edge beads.
Figure 11B:
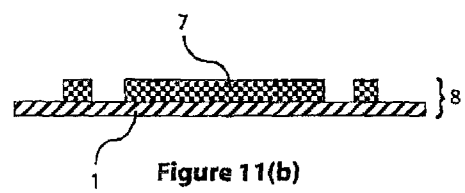

In some embodiments, said edge-bead 21 in the insulating pattern layer 7, illustrated in FIG. 11(*a*), can be removed by using edge-bead removing methods such as dissolving in organic solvents, mechanical removing and/or by removing insulating pattern layer edge-bead area by said lithographical and/or etching methods. FIG. 11(*b*) illustrates a master electrode 8 were the edge-bead 21 in the insulating pattern layer 7 has been removed by using said edge-bead removing methods.

In some embodiments, during the fabrication of the master electrode 8, the electrical resistance of the conducting/semiconducting parts of the carrier 1 and the conducting electrode layer 4 may be matched to the resistance of the seed layer 17 on a substrate 17 on which ECPR etching and/or plating is performed. The resistance of the carrier 1 and/or conducting electrode layer 4 can be decreased or increased by choosing materials with lower or higher resistivity respectively and/or by making the carrier 1 and/or the conducting electrode layer 4 thicker or thinner respectively. The total resistance for an electrical current during ECPR etching and/or plating is determined by the sum of the resistance of the following paths:

1. the conducting/semiconducting parts of the carrier 1,
2. the conducting electrode layer 4,
3. electrochemical cells 23 formed in ECPR etching and/or plating and
4. the seed layer of the substrate (18)

For convenience, the resistance of a path through said conducting/semiconducting parts of said carrier 1 is called R.sub.1; the resistance of a path through said conducting electrode layer 4 is called R.sub.4; the resistance of a path through the seed layer 18 is called R.sub.18; and the resistance of a path through said electrochemical cells 23 formed in ECPR etching and/or plating is called R.sub.23.

In some embodiments, the carrier 1 and the conducting electrode layer 4 of the master electrode 8 are characterized in that a current supplied during ECPR etching and/or plating will experience the same total resistance when passing through the carrier 1, conducting electrode layer 4 and the seed layer 18, independently on in which area it passes the electrochemical cells 23. In some embodiments, this is done by supplying an electrical contact from an external power supply only to the center of the back-side of the carrier 1 and to the perimeter of the seed layer 18 on the substrate 17. In this case, if the total electrical resistance for a current passing from the center of the back-side of the carrier 1, through the said carrier, conducting electrode layer 4 and the seed layer 18 to the electrical contacts at the perimeter is the same independent on in which area it passes through the electrochemical cells 23, the current density that passes during ECPR etching and/or plating will be the same independent on the location of the electrochemical cells with respect to the seed layer electrical contacts. Thereby, the etching and/or plating rate, which is linearly proportional to the current density, will be the same in all electrochemical cells 23, independent on the location. The described master electrode/seed layer resistance matching reduces or even eliminates a problem of radial dependent non-uniformal etching/plating rates, resulting in non-uniform radial height distribution, inherently associated with conventional electrodeposition/electrochemical etching methods; said problems being described as the terminal effect.

In some embodiments, such as at thin seed layer, the total resistance of the carrier 1 and conducting electrode layer 4 is lower than the resistance of the seed layer 18, causing the current density to become higher in the electrochemical cells 23 that are located closer to the perimeter than in the center of the substrate and master electrode when performing ECPR etching and/or plating. In other embodiments, such as at thick seed layer, the total resistance of the carrier 1 and conducting electrode layer 4 is higher than the resistance of the seed layer 18, causing the current density to become lower in the electrochemical cells 23 that are located closer to the perimeter than in the center of the substrate 17 and master electrode 8 when performing ECPR etching and/or ECPR plating.

For instance, a resistance R' of the path to and from the electrochemical cells 23 in the center can be matched to the resistance R" of the path to and from the electrochemical cells in the perimeter, illustrated in FIG. 12(*a*), so that:

1. if R'=1/(1/R.sub.1'+1/R.sub.4')+R.sub.18' is equal to R"=1/(1/R.sub.1"+1/R.sub.4")+R.sub.18", then j'=j"; or 2. if R'=1/(1/R.sub.1'+1/R.sub.4')+R.sub.18' is greater than R"=1/(1/R.sub.1"+1/R.sub.4")+R.sub.18"+, then j'<j"; or 3. if R'=1/(1/R.sub.1'+1/R.sub.4')+R.sub.18' is less than R"=1/(1/R.sub.1"+1/R.sub.4")+R.sub.18", then j'>j", where j' is the current density in the electrochemical cells in the center and j" is the current density in the electrochemical cells in the perimeter.

By matching the resistances R.sub.1 and R.sub.4 to R.sub.18 in different ways, a specific height distribution of ECPR etched or plated structures along a radial direction from the center to the perimeter of the master electrode can be achieved.

More specifically, in some embodiments, the matching of the resistances in the master electrode to the resistance in the seed layer is done by adjusting the thickness of the layers to the resistivity of the materials. In an embodiment, the thicknesses and the resistivity of the carrier 1 and the conducting electrode 4 are matched to that of the seed layer, so that R.sub.1+R.sub.4=R.sub.18 which gives a uniformly distributed current density (i.e. plating or etching rate) in radial direction. FIG. 12(*b*) illustrates the radial heights distribution in of ECPR etched or plated structures (24).

In another embodiment, the thicknesses and the resistivity of the carrier 1 and the conducting electrode 4 are matched to that of the seed layer, so that R.sub.1+R.sub.4<R.sub.18 which gives a higher current density in the areas located closer to the center and to the perimeter. FIG. 12(*c*) illustrates the radial heights distribution in of ECPR etched or plated structures 24.

In a further embodiment, the thicknesses and the resistivity of the carrier 1 and the conducting electrode 4 are matched to that of the seed layer so that R.sub.1+R.sub.4>R.sub.18 which gives a higher current density in the areas located closer to the center and to the perimeter. FIG. 12(*d*) illustrates the radial heights distribution in of ECPR etched or plated structures 24.

In some embodiments, the conducting parts (for instance a conducting/semiconducting disc 2) of the carrier 1 is only connected to the conducting electrode layer 4 in the center on the front-side due to an insulating material coating 3 as illustrated in FIG. 1(*d*). In this case, it is only the resistivity and thickness of the conducting electrode layer 4 that needs to be matched with a seed layer 18.

Figure 13A:
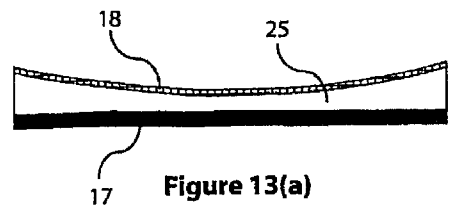
FIGS. 13(*a*) and 13(*b*) are cross-sectional views similar to FIGS. 12(*c*) and 12(*d*) in which the substrate is concave from the start.
Figure 13B:
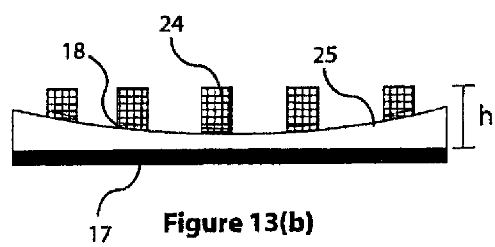
Figure 14A:
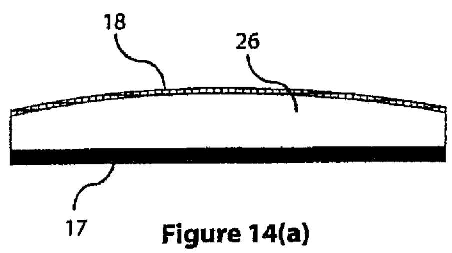
FIGS. 14(*a*) and 14(*b*) are cross-sectional views similar to FIGS. 13(*a*) and 13(*b*) in which the substrate is convex from the start.
Figure 14B:
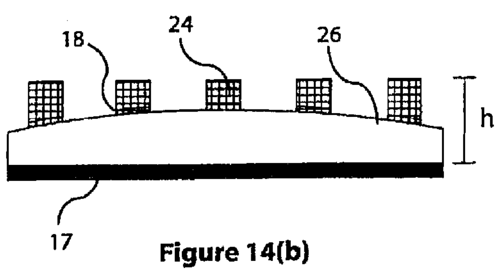
Figure 15A:
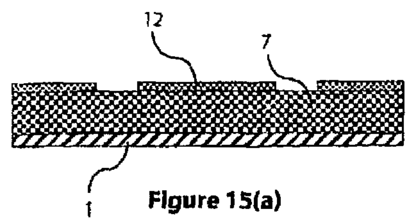
FIGS. 15(*a*) to 15(*e*) are schematic cross-sectional views of an embodiment of a master electrode provided with three-dimensional cavities in a pattern layer.
Figure 15E:
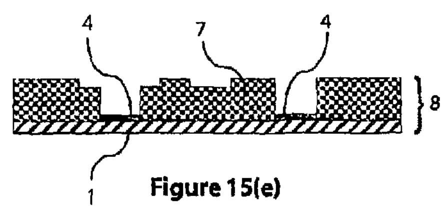
Figure 15B:
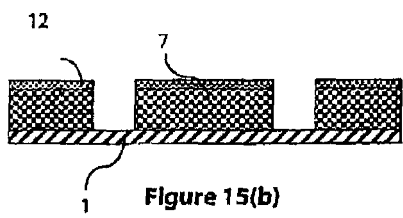

In some embodiments, a radial depending height distribution of ECPR etched or plated structures can be used to compensate a different height distribution that comes from a previous or subsequent process step. In one embodiment, the resistance in the master is matched to a seed layer 18, which is applied with a uniform thickness (for instance by PVD) onto a substrate 17 with a concave layer 25 illustrated in FIG. 13(*a*), so that 1/R.sub.1+1/R.sub.4<1/R.sub.18, and ECPR etched or plated structures 24 is fabricated with a convex radial height distribution that compensates for the concave layer so that the top of said ECPR etched or plated structures 24 end up at the same height h from the substrate, as illustrated on FIG. 13(*b*). In another embodiment, the resistance in the master is matched to a seed layer 18, which is applied with a uniform thickness (for instance by PVD) onto a substrate 17 with a convex layer 26 illustrated in FIG. 14(*a*), so that 1/R.sub.1+1/R.sub.4>1/R.sub.18, and ECPR etched or plated structures 24 is fabricated with a concave radial height distribution that compensates for the convex layer so that the top of said ECPR etched or plated structures 24 end up at the same height h from the substrate, as illustrated on FIG. 14(*b*).

The method for matching the resistance in the master electrode to the seed layer is in no way limited to the master electrode embodiment illustrated in FIG. 12, and it can be used for all embodiments of master electrodes.

In order to achieve certain plating or etching effects, the master electrode may be arranged with a disc and electrode layer having different thicknesses from the centrum and/or having different materials from the centrum; said different materials having different resistivity. For example, the thickness may be halved or alternatively the resistivity may be doubled at half the radial distance from the centrum. If the inner half is adapted to the seed layer resistance, the structures in the corresponding area will have a uniform height, while the structure corresponding to the outer half will have a decreasing height. Further designs are possible.

In some embodiments, alignment marks can be fabricated in at least some parts of the master electrode in order to be able to align the master electrode to a substrate used in ECPR etching and/or plating. In some embodiments, said alignment marks comprise structures and/or cavities on the master electrode. The structures and/or cavities can be manufactures with said lithographical and/or etching methods. The material for the alignment marks can be the same as can be used for said carrier, said conducting electrode layer and/or said insulating pattern layer. The alignment marks can be located on said carrier, on said conducting electrode layer and/or on said insulating pattern layer. In some embodiments, the alignment marks can be a part of the structures or cavities of the insulating pattern layer. In some embodiments, the alignment marks can be manufactured in the same step as uncovering some parts of said insulating coating layer on the back-side of said carrier. In an embodiment, the master electrode comprises a carrier, which is transparent in the light used for alignment (e.g. ultra-violet light, visual light, infra-red light and/or X-rays), a conducting electrode layer and an insulating pattern layer which comprise said alignment marks. If the conducting electrode layer is not transparent to the light used for alignment, there can be openings in the conducting electrode layer where the alignment marks are/or shall be placed, so that it will be possible for the light used for alignment to pass through the master electrode where the openings are. The openings can be produced when the carrier is being covered by the conducting electrode layer (e.g. by covering the specific area during the deposition process). The openings can also be produced after the conducting electrode layer has been applied (e.g. using said mechanical, lithographical and/or etching methods). In some embodiments, the alignment structures are made of a transparent material which will make it easier to align through the master when aligning against the substrate. Alternatively, the alignment marks is fabricated in the conducting electrode layer and/or carrier. If the insulating pattern layer is non-transparent, openings can be made in the insulating pattern layer in the areas of alignment marks using said lithographical and/or etching methods. Said openings in the insulating pattern layer are in some embodiments fabricated when patterning said insulating pattern layer. In some embodiments, said alignment marks comprise a material which is non-transparent and can be located onto a portion of otherwise transparent materials, such as a metal onto quartz, in this way enabling a good contrast of the alignment marks. In some embodiments, the master electrode comprises a non-transparent carrier with alignment marks on the back-side, a conducting electrode layer and an insulating pattern layer. The structures of the insulating pattern layer on the front-side of the master electrode can then be aligned relative to the alignment marks on the back side. Alternatively, the alignment marks are fabricated after making the insulating pattern layer and the alignment marks on the back-side are aligned relative to the insulating pattern on the front-side. In some embodiment, the alignment structures are a part of the insulating pattern layer and/or conducting electrode layer even if the master electrode comprises a non-transparent carrier, for instance when using a face-to-face alignment method. In some embodiments such as when using a non-transparent carrier, alignment marks can be fabricated in the conducting electrode layer and/or insulating pattern layer on the front-side of the master electrode; and through holes can be made in the carrier, using said lithographical and etching methods, in the areas of the alignment marks thereby making said alignment marks visible also from the back-side which allows for the use of back-side alignment methods. In one embodiment, said through holes can be fabricated after forming the conducting electrode layer and insulating pattern layer and in some cases said through holes can be filled with an transparent material. In other cases, said through holes are fabricated prior to forming said conducting electrode layer and insulating pattern layer, such as when firstly filling said through holes with a transparent material.

In some embodiments, aligning methods can include a calibration procedure characterized by measuring the overlay error of ECPR etched or plated structure layers formed with a certain master electrode and then compensating for said error when using said master electrode in subsequent ECPR etching or plating steps. This can be useful for instance when having back-side alignment keys on the master electrode.

In some embodiments, the insulating pattern layer can be fabricated with a pattern that compensates for or is adapted to the topography on the substrate used in ECPR etching and/or ECPR plating.

In some embodiments, this can be done using a master electrode having an insulating pattern layer with at least one cavity in the area corresponding to the area with topography on the substrate when the master electrode and substrate are put in close contact when performing ECPR etching and/or plating. In some embodiments, the cavities made to compensate for topography on the substrate do not have be as deep as the rest of the cavities of the insulating pattern layer. If the cavities around the topography do not reach the conducting electrode layer of the master electrode, no ECPR etching and/or plating will occur in this specific area, which can be used in some embodiments. In some embodiments, the insulating pattern layer can be fabricated with structures of different heights by patterning the insulating layer more than once. Some of the topography of the substrate may be free from electrically conducting material, such as seed layer.

In one embodiment, firstly the insulating pattern layer is formed using said lithographical and/or etching methods, creating cavities reaching down to the carrier or conducting electrode and secondly the insulating pattern layer is patterned once more in at least some areas, creating cavities that compensate for topography on the substrate but do not reach the carrier or conducting electrode layer.

FIG. 15(*a*) illustrates how an etch-mask 12 is applied and patterned on top of an insulating pattern layer 6 on a carrier using said lithographical methods.

FIG. 15(*b*) illustrates how cavities, that reach down to the underlying carrier 1, are etched into said insulating pattern layer in the areas that are not protected by said etch-mask 12 using said etching methods.

FIG. 15(*c*) illustrates how the first etch-mask is removed, a second etch-mask 12 is applied and patterned onto some parts of the previously etched insulating pattern layer 6 using said lithography methods. Alternatively, the first etch-mask is patterned a second time instead of removing the first etch-mask and applying and patterning a second etch-mask.

FIG. 15(*d*) illustrates how a second layer of cavities, that can compensate for topography on a substrate, are etched into the insulating pattern layer using said etching methods in the areas that are not protected by the etch-mask 12. FIG. 15(*e*) illustrates the finishing of a master electrode 8 after said etch-mask has been removed and after a conducting electrode layer 4 is applied onto said carrier in the cavities of the insulating pattern layer. The top layer of cavities can compensate for topography in a substrate and the bottom layer of cavities, reaching down to the conducting electrode layer, can be used for forming ECPR etched or plated structures.

In another embodiment, firstly the insulating pattern layer is patterned using said lithographical and/or etching methods creating cavities that compensate for topography on the substrate but do not reach the carrier or conducting electrode layer below and secondly the insulating pattern layer is patterned once more to create the cavities that reach the carrier or conducting electrode layer below.

Figure 16A:
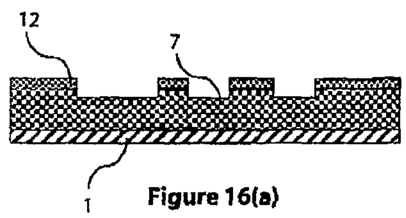
FIGS. 16(*a*) to 16(*c*) are schematic cross-sectional views of another embodiment of a master electrode provided with three-dimensional cavities in a pattern layer.
Figure 15C:
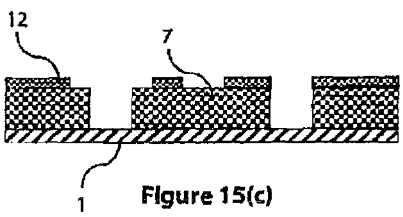
Figure 16B:
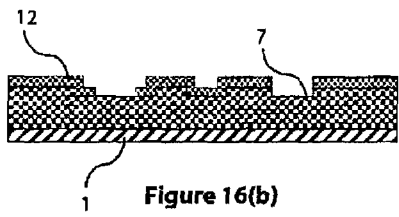
Figure 15D:
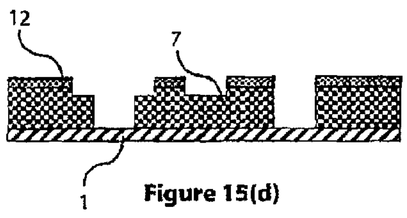
Figure 16C:
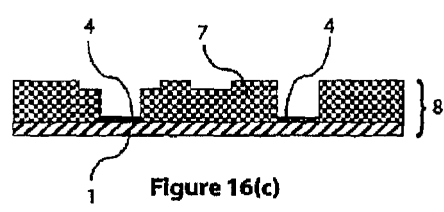
Figure 17A:
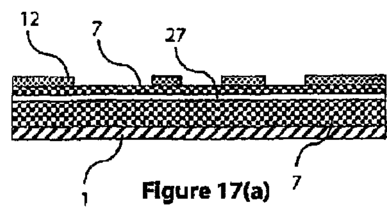
FIGS. 17(*a*) to 17(*e*) are schematic cross-sectional views of a further embodiment of a master electrode provided with three-dimensional cavities in a pattern layer.
Figure 17E:
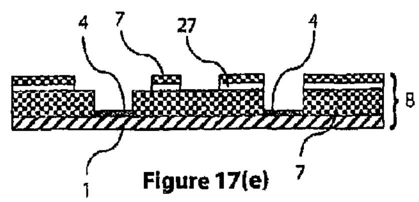
Figure 17B:
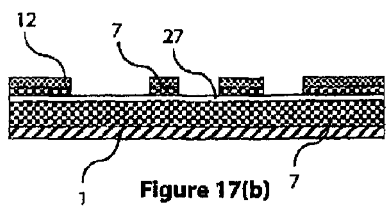
Figure 17C:
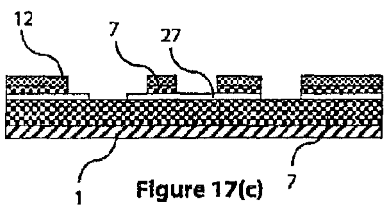
Figure 17D:
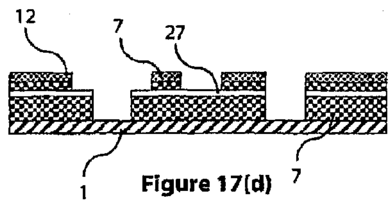

FIG. 16(*a*) illustrates how an etch-mask 12 is applied and patterned using said lithography methods; and how cavities in the insulating pattern layer 6 is etched in the areas that are not protected by said etch-mask. These firstly created cavities can compensate for topography on a substrate and are not reaching down to the underlying carrier 1.

FIG. 16(*b*) illustrates how the first etch-mask is removed and how a second etch-mask 12 is applied and patterned using said lithographical methods thereby only covering the areas on the insulating pattern layer 6 that is not intended to be etched down to the carrier 1 in a subsequent step.

FIG. 16(*c*) illustrates the finishing of a master electrode 8 by creating cavities in the insulating pattern layer 6 by etching down to the carrier 1 in the areas not protected by said second etch-mask 12; and by removing said etch-mask; and applying a conducing electrode layer 4 in onto said carrier in the cavities of the insulating pattern layer. The firstly formed cavities of the insulating pattern layer can compensate for topography on a substrate.

In some embodiments, forming a master electrode with an insulating patter layer that can compensate for topography on a substrate includes applying multiple layers of insulating material and at least one etch-stop layer, said etch-stop layer being arranged between two insulating pattern layers. Said etch-stop layer can comprise materials mentioned above, such as SiN or SiO.sub.2 and can be applied with methods mentioned above, such as PVD, CVD or PECVD. This embodiment includes firstly etching down cavities in a top insulating pattern layer down to the etch-stop layer; removing (i.e. patterning) portions of the etch-stop layer using said lithographical and etching methods; and etching another layer of cavities in the bottom insulating pattern layer using said patterned etch-stop layer as an etch-mask down to an underlying etch-stop layer, carrier or conducting electrode layer. The sequence can be repeated multiple times in order to create a master electrode with an insulating pattern layer with multiple layers of cavities.

FIG. 17(*a*) illustrates how two insulating pattern layers 7 are applied, with an etch-stop layer 27 arranged between, onto a carrier 1; and how an etch-mask 12 is applied and patterned onto the top insulating pattern layer.

FIG. 17(*b*) illustrates how portions of the top insulating pattern layer 7 are etched in the areas that are not protected by said etch-mask 12 forming a top layer of cavities. The etching is stopped when the top layer cavities reach down to said etch-stop layer 27.

FIG. 17(*c*) illustrates how portions of said etch-stop layer 27 is removed by methods such as said lithographical and etching methods, thereby uncovering at least some portions of the underlying insulating pattern layer 7.

FIG. 17(*d*) illustrates how portion of the bottom insulating pattern layer 7 are etched in the areas that are not protected by said patterned etch-stop layer 27 forming a bottom layer of cavities, said cavities reaching down to the underlying carrier 1.

FIG. 17(*e*) illustrates the finishing of a master electrode 8 by removing said etch-mask 12; and removing the portions of said patterned etch-stop layer 27 that are not protected by the top insulating pattern layer 6; and applying a conducting electrode layer 4 onto said carrier 1 in the cavities of the bottom insulating pattern layer.

In one embodiment, cavities in the insulating pattern layer are firstly created as an imprint of a substrate template having the same topography as the substrate surface and secondly said insulating pattern layer is patterned, creating cavities down to the underlying carrier or conducting electrode layer.

Figure 18A:
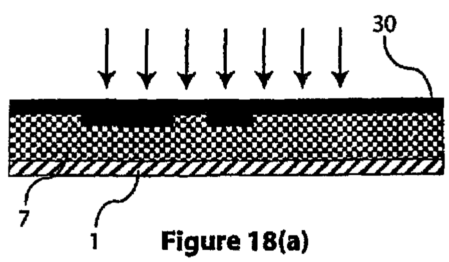
FIGS. 18(*a*) to 18(*c*) are schematic cross-sectional views of a still further embodiment of a master electrode provided with three-dimensional cavities in a pattern layer.
Figure 18B:
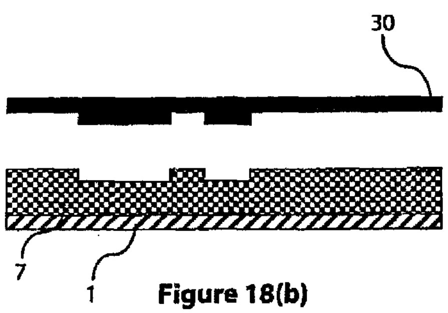
Figure 18C:
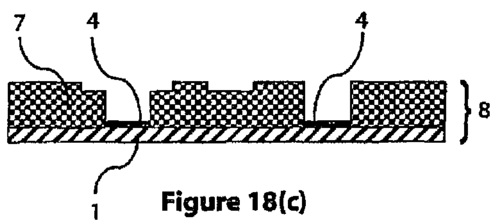
Figure 20A:
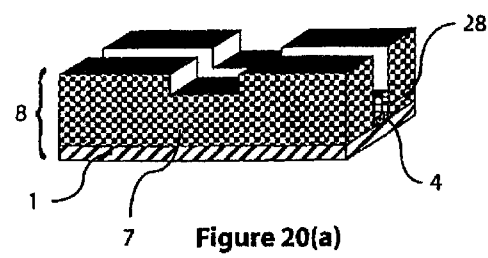
FIG. 20(*a*) is a schematic cross-sectional view of a yet further embodiment of a master electrode provided with three-dimensional cavities in a pattern layer.
Figure 20B:
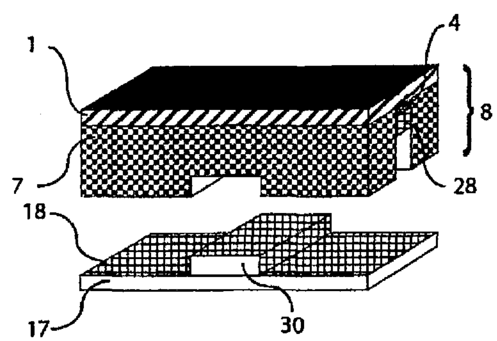
Figure 20C:
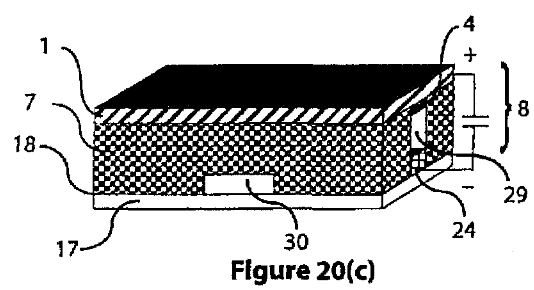
Figure 20D:
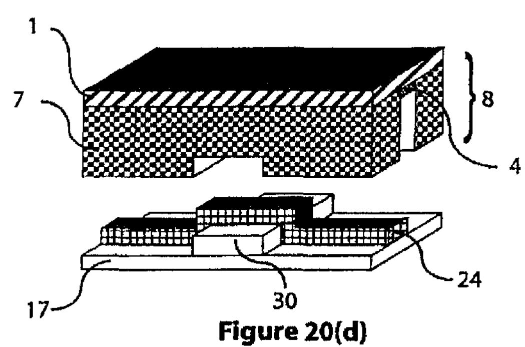

FIG. 18(*a*) illustrates how a substrate template 30 is forced against an insulating pattern layer 7 on a carrier 1, thereby creating cavities in said insulating pattern layer which are an imprint of the protruding parts of the substrate template.

FIG. 18(*b*) illustrates how cavities has been created in said insulating pattern layer 7 on a carrier 1 after removing said substrate template 30.

FIG. 18(*c*) illustrates the finishing of a master electrode 8 by patterning said insulating pattern layer 6, into which firstly an imprint of a substrate template has been formed, down to said carrier 1 by using said lithography and etching methods; and by applying a conducting electrode layer 4 onto said carrier in the bottom of the cavities of the insulating pattern layer. In some embodiments, forming a master electrode comprising an insulating pattern layer that can compensate for topography on a substrate can include: applying a layer of negative photoresist and/or a UV-curing polymer, using the above mentioned methods for applying an insulating pattern layer; exposing said layer to UV-light through a photomask; applying a second layer of photoresist and/or a UV-curing polymer; exposing said second layer to UV-light through a second photomask; and if necessary, performing an post-exposure-bake (PEB) step prior to developing both layers simultaneously. In some embodiments, a hard bake is performed in order to improve adhesion between said layers as well as mechanical and chemical properties. Two or more patterned layers may be fabricated on top of each other using this concept. Alternatively, direct write methods such as laser-beam or E-beam exposure may be used instead of exposing said layers with UV-light through a photomask.

Figure 19A:
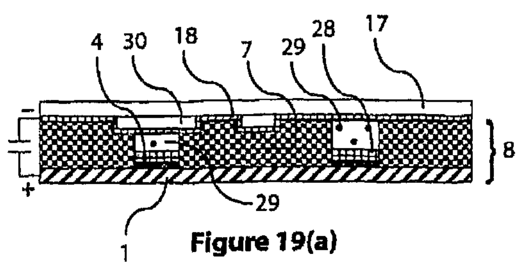
FIGS. 19(*a*) to 19(*b*) are schematic cross-sectional views showing the use of the embodiment of the master electrode of FIGS. 18(*a*) to 18(*c*)
Figure 19B:
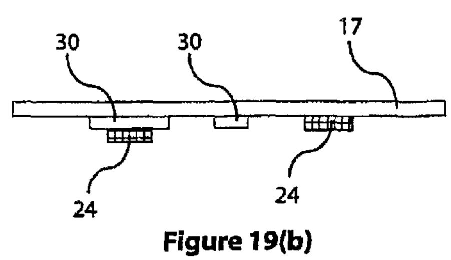

FIG. 19(*a*) illustrates how the master electrode 8 with a predeposited anode material 28 is put into contact with a substrate 17 with a seed layer 18 enclosing electrolyte 29 in the cavities of the insulating pattern layer 6 in order to form plated structures 24 and how the insulating pattern layer is compensating for topography 30 on the substrate.

FIG. 19(*b*) illustrates the substrate 17 with topography 30 after removing the master electrode and how plated structures 24 have been formed and after removing the seed layer 18 in the areas between the structures.

In some embodiments, the insulating pattern in the master electrode can be fabricated so that it is possible to form etched or plated structures that are continuous across a topography portion on a substrate (i.e. not only on top of or adjacent to the substrate topography).

FIG. 20(*a*) illustrates a master electrode 8 comprising an insulating pattern layer 7 with a top layer of cavities that compensates for topography 30 on a substrate 17 and a seed layer 18. The insulating pattern layer also comprises a bottom layer of cavities reaching down to a conducting electrode layer 4 on a carrier 1. An anode material 28 is predeposited onto the conducting electrode layer.

FIG. 20(*b*) illustrates said master electrode 8 and a substrate 17; said master electrode having an insulating pattern layer 7 that compensate for topography 30 on said substrate; said substrate having a seed layer 18 applied onto the top surface.

FIG. 20(*c*) illustrates how the master electrode 8 is put into contact with a substrate 17 with a seed layer 18 enclosing electrolyte 29 in the cavities of the insulating pattern layer 7 where plated structures 24 on the substrate is formed. The insulating pattern layer 7 also has cavities that compensate for the topography 30 on the substrate.

FIG. 20(*d*) illustrates how plated structures are formed onto a substrate 17 with topography 30 after the master electrode 8 is removed and after the seed layer 18 is removed in the areas that are not covered by the plated structures.

In some embodiments, an etching pattern is created with an electrochemical process by using the conducting electrode layer of the master electrode as cathode whereby material is dissolved from the substrate, transferred in the electrolyte and deposited on the cathode thereby creating ECPR etched structures on the substrate corresponding to the pattern of insulating pattern layer on the master electrode. Since the material that is being dissolved from the substrate, which is anode, also is deposited at the conducting electrode layer, which is cathode, the amount of dissolved anode material in the electrolyte remains close to constant during the electrochemical process. If the deposition rate of the dissolved material is zero, the concentration of dissolved anode material ions in the electrolyte increases quickly, this slows down the electrochemical reaction until it eventually stops. A too high ion concentration can also result in precipitation of salts. In this case, only small amounts could be dissolved from the substrate and only thin layers could be patterned. Instead, by making sure that the dissolution reaction has an appropriate deposition reaction, thicker layers substrate can be etched. The dissolution and deposition reaction in the electrochemical process is determined by the thermodynamic and kinetic reaction at a given applied potential in a specific system of anode, cathode and electrolyte. By choosing the appropriate anode material, cathode material and electrolyte, the desired dissolution and deposition reaction can be achieved since they are thermodynamically and kinetically favorable in the chosen system.

One example of appropriate anode, cathode and electrolyte system is Ni as anode material, Au as a cathode material and a Watt's bath used as electrolyte. In some aspects, the deposition reaction does not have to be corresponding to the dissolution reaction exactly. As long as the deposition rate of the dissolved material is larger than zero, the buildup of ion concentration of anode material in the electrolyte will be slow which means that it will take longer time before the reaction stops and hence thicker layers on the substrate can be etched. For instance, the deposition rate of the dissolved ions can be 90-100% of the dissolution rate. In this example, the ion concentration of dissolved anode will increase slowly, but in some aspects a desired etched thickness can be achieved before the concentration becomes too high. In some cases, the dissolution rate can be lower than the deposition speed which eventually leads to depletion of ion concentration in the electrolyte. However, if the dissolution reaction is not too low compared to the deposition reaction (e.g. >90% of the deposition rate), a desired thickness can still be etched from the substrate before depletion of anode material ions in the electrolyte. One example of an inappropriate system is Ag as anode material, Al as cathode material and an alkaline silver cyanide bath as an electrolyte. In this example, the deposition rate of silver ions is zero which will lead to a fast buildup of silver ions in the electrolyte.

A plating pattern is created by an electrochemical process by using the conducting electrode layer of the master electrode as anode and having predeposited anode material on the anode inside the cavities defined by the master electrode whereby said anode material is dissolved, transferred in the electrolyte and deposited on the substrate, being cathode, thereby creating ECPR plated structures on the substrate corresponding to the cavities of the insulating pattern layer on the master electrode.

Figure 23A:
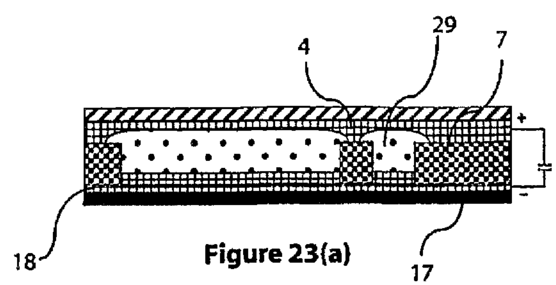
FIG. 23(*a*) is a schematic cross-sectional view showing how a conducting electrode layer of an electrode is dissolved in an electrochemical cell and are undercutting the insulating pattern layer of said electrode.
Figure 23B:
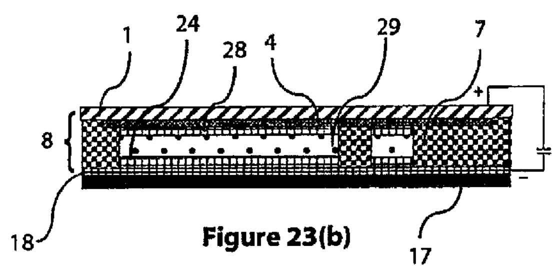

One problem with prior art processes which do not have a predeposited material is that anode material is dissolved directly from conducting electrode layer 4 in the master, the master electrode will eventually wear out since the dissolved material is undercutting the insulating pattern layer 7, as illustrated in FIG. 23(*a*). By having a predeposited anode material 28 in the cavities of the master electrode 8, it is possible to have a conducting electrode layer 4 comprising an inert material that does not dissolve during the electrochemical process and no undercutting of the insulating pattern layer 7 occurs, as illustrated in FIG. 23(*b*). Thereby, the master electrode can be resused a large number of times which leads to a more cost and time efficient patterning process.

Another problem with prior art processes, which do not have predeposited material is that the dissolved material that is undercutting the insulating pattern layer leads to that the anode area increases differently in large contra small cavities in the insulating pattern layer. In large cavities, the area increase due to undercutting is smaller than in small cavities, as illustrated in FIG. 23(*a*). Increasing the anode area leads to a higher current density (i.e. plating rate) at the cathode. Hence, the structures plated in the small cavities of the insulating pattern layer will be deposited with a higher plating rate than the structures in the large cavities leading to an uneven thickness distribution that depends on the pattern. Also this problem is solved by having a predeposited material, since no area increase will occur and thereby the current density (plating rate) will be the same in all cavities, non-depending on the size of the patterns.

Also, the dissolution of predeposited material prevents the depletion of the concentration of ions in the electrolyte that are deposited on the cathode. A depletion of ions in the electrolyte would gradually slow down the deposition process until it eventually stops and only thin layers of plated structures would be achievable. By having a sufficient amount of predeposited material that is being dissolved during the electrochemical deposition reaction, the ion concentration remains stable and thicker layers of plated structures can be achieved. By choosing the appropriate predeposited material (anode), seed layer material (cathode) and electrolyte, the desired dissolution and deposition reaction can be achieved since they are thermodynamically and kinetically favorable in the chosen system. One example of an appropriate choice of electrochemical system is: having Cu as predeposited material (anode), Cu as seed layer (cathode) and an acidic copper sulfate bath as an electrolyte. In some cases, the deposition reaction does not have to be corresponding to the dissolution reaction exactly. As long as the dissolution rate of the predeposited material is larger than zero, the depletion of ion concentration in the electrolyte will be slower which means that it will take longer time before the reaction stops and hence thicker layers can be plated. For instance, the dissolution rate can be 90-100% of the deposition rate. In this example, the ion concentration of material being deposited will decrease slowly, but in some aspects a desired plated thickness can be achieved before the concentration becomes too low.

In all embodiments, the insulating pattern layer can be patterned in order to compensate for topography with different heights and shapes by repeating said lithography and/or etching steps and thereby creating multiple layers of cavities that can compensate for multiple layers of topography on a substrate. The compensating cavities do not need to be exactly adapted to the topography 30 but may be arranged to be larger so that the topography may be included inside the cavities with some margin.

In some embodiments, said master electrodes that comprise an insulating pattern layer with multiple layers of cavities can be used for forming multiple ECPR plated structure layers in one single process step; said structure layer being defined by said multiple layers of cavities in the insulating pattern layer.

Figure 21A:
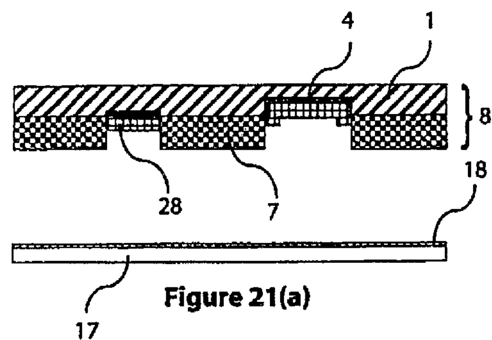
FIGS. 21(*a* to 21(*b*) are schematic cross-sectional views showing an embodiment of the master electrode having cavities of different depths with an uneven distribution of predeposited material.
Figure 21B:
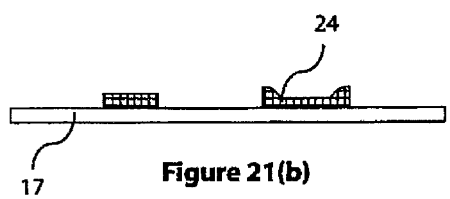

In some embodiments, the master electrode is arranged using methods that results in very uniform height distribution of ECPR etched or plated structure layers. However, in some other embodiment, at least some portion of the carrier and/or conducting electrode layer can be altered in the cavities of an insulating pattern layer in order to give a non-uniform pattern in a portion of said structure layer. In one embodiment, the carrier 1 of a master electrode 8 can have a recess in at least one cavity of an insulating pattern layer 7; said recess being coated on the walls with a conducting electrode layer 4; and a predeposited anode material 28 is arranged onto said conducting electrode layer, as illustrated in FIG. 21(*a*). During ECPR plating on a substrate 17 inside said cavities with said recesses, the areas located closer to the walls of the insulating pattern layer 7 will achieve a higher current density (plating rate) resulting in a larger height of the ECPR plated structures 24, as illustrated in FIG. 21(*b*).

Figure 22A:
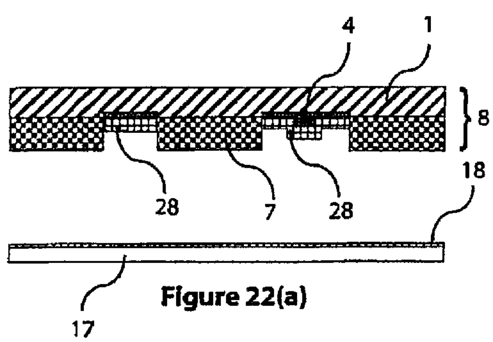
FIGS. 22(*a* to 22(*b*) are schematic cross-sectional views showing another embodiment of the master electrode having cavities with an uneven distribution of predeposited material.
Figure 22B:
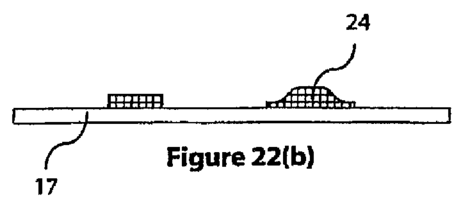

In another embodiment, the carrier 1 and the conducting electrode layer 4 exert a protruding structure in at least one cavity of an insulating pattern layer 7; and a predeposited anode material 28 is arranged onto said conducting electrode layer, as illustrated in FIG. 22(*a*). During ECPR plating on a substrate 17 inside said cavities with protruding structures, the areas on the substrate located closer to the protruding structure will achieve a higher current density (plating rate) resulting in a larger height of the ECPR plated structures 24, as illustrated in FIG. 22(*b*). In some case, the embodiments for creating structure layers with a non-uniform height such as in FIG. 21(*b*) and FIG. 22(*b*) can be used for applications such as interlocking bump structures, solder ball placement foundations or mechanical alignment structures/fiducials.

Herein above, several method steps have been described in different combinations and constellations. However, it is emphasized that other combinations may be performed as occur to a skilled person reading this specification, and such combinations are within the scope of the present invention. Moreover, the different steps can be modified or altered still within the scope of the invention. The invention is only limited by the appended patent claims.

It is apparent that a system and method with significant advantages has been described and illustrated. The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed is:

1. A method of forming a master electrode, comprising:

providing a disc of at least one layer of a conducting and/or semi-conducting material;

forming an insulating pattern layer at least partly of at least one layer of an insulating material;

forming at least one recess in the front side of said insulating material;

forming a conducting electrode layer of an electrode forming, conducting material in each recess; and forming at least one recess at the back side of said insulating pattern layer;

wherein a planarization step is performed on said disc.

2. The method of claim 1, wherein the insulating material is applied with a method selected from the group comprising: thermo-oxidation, Plasma-Enhanced-Chemical-Vapor Deposition (PECVD), Physical Vapor Deposition (PVD), Chemical-Vapor-Deposition (CVD), electrical anodization, Atomic-Layer-Deposition (ALD), spin-coating, spray-coating, roller-coating, powder-coating, adhesive taping, pyrolysis, bonding, and combinations thereof.

3. The method of claim 1, wherein said conducting electrode layer is applied with methods selected from the group comprising: ALD, Metallorganic-Chemical-Vapor-Deposition (MOCVD), PVD, CVD, sputtering, electroless deposition, immersion deposition, electrodeposition, electro-grafting, chemical grafting and combinations thereof.

4. The method of claim 1, wherein said conducting electrode layer is treated by thermal methods selected from the group comprising: rapid-thermal-annealing (RTA), furnace heating, hot-plate heating, and combinations thereof.

5. The method of claim 4, wherein said conducting electrode layer is formed by applying several layers of at least one material and by treating at least one layer by said thermal methods before applying a next layer.

6. The method of claim 1, further comprising arranging an adhesion layer on at least some parts of said disc prior to arranging said insulating pattern layer, wherein said adhesion layer comprises at least one layer of material that improves the adhesion properties between the insulating pattern layer and the disc, wherein said adhesion layer is applied using deposition methods selected from the group comprising: electrodeposition, spin-coating, spray-coating, dip-coating, Molecular-Vapor-Deposition (MVD), ALD, MOCVD, CVD, PVD, sputtering, electroless deposition, immersion deposition, electrografting, chemical grafting, and combinations thereof.

7. The method of claim 1, wherein a planarization step is performed on the arranged insulating pattern layer, wherein said planarization step is performed by a method selected from the group comprising: chemical-mechanical-polishing (CMP), lapping, contact planarization (CP), ion-sputtering, reactive-ion-etching (RIE), plasma-assisted-etching, laser-ablation, ion-milling, and combinations thereof.

8. The method of claim 1, wherein the at least one recess in said insulating pattern layer is formed by using lithography, etching methods, and/or mechanical abrasive methods.

9. The method of claim 8, wherein said etching methods comprise arranging a patterned etch-mask onto at least some areas of said insulating pattern layer, said areas being protected from etching, wherein said patterned etch-mask is produced by lithography and/or etching methods, wherein said etch-mask is comprised of a polymer resist used in said lithographical methods or a hard-mask.

10. The method of claim 9, wherein said etch-mask comprises at least one structure layer forming in said at least one electrochemical cell formed by a further master electrode.

11. The method of claim 1, further comprising: using a damascene process is used to create the cavities of said insulating pattern layer, said damascene process involving applying a sacrificial pattern layer, having recesses, onto the disc; applying an insulating material so that it covers said sacrificial pattern layer and fills up the recesses of the sacrificial pattern; planarizing said insulating material until the sacrificial pattern layer is uncovered; and removing said sacrificial pattern layer to form an insulating pattern layer, wherein said sacrificial pattern is arranged by applying a material which is patterned by lithography, plating, and/or etching methods or said sacrificial pattern layer comprises at least one structure layer being formed in an electrochemical cell with a further master electrode.

12. The method of claim 1, further comprising coating a release layer onto at least some parts of the insulating pattern layer.

13. The method of claim 1, further comprising treating at least some surfaces of said insulating pattern layer with thermal treatment, oxygen/nitrogen/argon plasma treatment, surface conversion for anti-sticking (SURCAS), strong oxidizing agents, or combinations thereof.

14. The method of claim 1, further comprising: forming the insulating pattern layer with lithographical and/or etching methods; creating cavities reaching down to the disc or conducting electrode; patterning the insulating pattern layer once more in at least some areas; and creating cavities that compensate for topography on the substrate but do not reach the disc or conducting electrode layer.

15. The method of claim 1, wherein said insulating pattern layer is patterned by repeating lithography and/or etching steps to thereby create multiple levels of cavities so as to compensate for multiple levels of topography of different heights and shapes on a substrate.

* * * * *